United States Patent [19]
Suzawa

[11] Patent Number: 5,998,841
[45] Date of Patent: *Dec. 7, 1999

[54] SEMICONDUCTOR DEVICE INCLUDING ACTIVE MATRIX CIRCUIT

[75] Inventor: Hideomi Suzawa, Kanagawa, Japan

[73] Assignee: Semiconductor Energy Laboratory Co., Ltd., Kanagawa-ken, Japan

[ * ] Notice: This patent is subject to a terminal disclaimer.

[21] Appl. No.: 09/166,157

[22] Filed: Oct. 5, 1998

Related U.S. Application Data

[62] Division of application No. 08/961,807, Oct. 31, 1997, Pat. No. 5,856,689, which is a division of application No. 08/807,001, Mar. 10, 1997, Pat. No. 5,712,495, which is a continuation of application No. 08/471,101, Jun. 6, 1995, abandoned.

[30] Foreign Application Priority Data

Jun. 13, 1994 [JP] Japan .................................... 6-154177

[51] Int. Cl.$^6$ ............................ H01L 27/01; H01L 27/12; H01L 31/0392
[52] U.S. Cl. ............................. 257/350; 257/59; 257/71; 257/72; 257/296; 257/351; 257/379
[58] Field of Search .................................... 257/59, 71, 72, 257/350, 351, 296, 379

[56] References Cited

U.S. PATENT DOCUMENTS

| | | | |
|---|---|---|---|
| 3,859,716 | 1/1975 | Tihanyl | 29/571 |
| 4,757,026 | 7/1988 | Woo et al. | 437/29 |
| 4,876,213 | 10/1989 | Pfiester | 437/34 |
| 5,182,620 | 1/1993 | Shimada et al. . | |
| 5,266,823 | 11/1993 | Noji et al. | 257/327 |
| 5,323,042 | 6/1994 | Matsumoto | 257/350 |
| 5,359,219 | 10/1994 | Hwang | 257/351 |
| 5,396,084 | 3/1995 | Matsumoto | 257/72 |
| 5,412,240 | 5/1995 | Inoue et al. | 257/347 |
| 5,412,493 | 5/1995 | Kunii et al. | 359/59 |
| 5,473,184 | 12/1995 | Murai | 257/382 |
| 5,495,121 | 2/1996 | Yamazaki et al. | 257/384 |
| 5,514,879 | 5/1996 | Yamazaki | 257/65 |
| 5,650,636 | 7/1997 | Takemura et al. | 257/59 |
| 5,712,495 | 1/1998 | Sugawa | 257/59 |
| 5,739,549 | 4/1998 | Takemura et al. | 257/59 |
| 5,856,689 | 1/1999 | Suzawa | 257/296 |

*Primary Examiner*—Ngân V. Ngô
*Attorney, Agent, or Firm*—Sixbey, Friedman, Leedom & Ferguson, PC; Eric J. Robinson

[57] ABSTRACT

There is provided a combination of doping process and use of side walls which allows the source and drain of a thin film transistor of an active matrix circuit to be doped with only one of N-type and P-type impurities and which allows the source and drain of a thin film transistor used in a peripheral circuit of the same conductivity type as that of the thin film transistor of the active matrix circuit to include both of N-type and P-type impurities. Also, a thin film transistor in an active matrix circuit has offset regions by using side walls, and another thin film transistor in a peripheral circuit has a lightly doped region by using side walls.

30 Claims, 5 Drawing Sheets

SEMICONDUCTOR DEVICE INCLUDING ACTIVE MATRIX CIRCUIT

This application is a divisional application of application Ser. No. 08/961,807, filed Oct. 31, 1997, now U.S. Pat. No. 5,856,689 which is a divisional application of application Ser. No. 08/807,001, filed Mar. 10, 1997, now U.S. Pat. No. 5,712,495, which itself is a continuation of application Ser. No. 08/471,101, filed Jun. 6, 1995, now abandoned.

BACKGROUND OF The INVENTION

1. Field of the Invention

The present invention relates to an active matrix circuit fabricated using thin film insulated gate type semiconductor devices (thin film transistors or TFTs) formed on an insulating substrate (in this specification, the "insulating substrate" generally means a material having an insulating surface and, unless otherwise defined, it implies not only an insulating material such as glass but also a material such as a semiconductor or metal having an insulator layer formed thereon). More particularly, the present invention relates to a monolithic active matrix circuit which includes peripheral circuits for driving it formed on the same substrate. A monolithic active matrix circuit according to the present invention is suitable for matrix type displays such as liquid crystal displays and plasma displays.

2. Description of the Related Art

As shown in FIG. 5, a monolithic active matrix circuit is comprised of an active matrix circuit area, a source driver, and a gate driver which are formed using substantially the same process. In an active matrix circuit, TFTs are used as switching elements for liquid crystal cells. In order to supplement the electrostatic capacity of the liquid crystal cells, auxiliary capacities are provided in parallel with the liquid crystal cells. The peripheral circuits such as the source driver and gate driver are constituted by a shift register and switching elements which must be capable of operating at high speed. Taking this into consideration, monolithic active matrix circuits are constructed using a crystalline semiconductor (e.g., polycrystalline silicon). Further, in order to suppress power consumption, the peripheral circuits are constructed using complementary circuits (CMOS). Such techniques are described in Japanese unexamined patent publication (KOKAI) No. H1-289917 in which switching TFTs in an active matrix circuit and a TFT that constitutes a shift register of a peripheral circuit are described as having substantially the same sectional structure.

However, TFTs as the switching elements in an active matrix circuit and TFTs in CMOS circuits such as a shift register do not operate in the same way. For example, for a TFT as a switching element, a high reverse bias voltage (a negative voltage if the TFT is of the N-channel type) is applied to the gate electrode. On the other hand, principally, no reverse bias voltage is applied to a TFT in a CMOS logic circuit. Further, the operating speed of the former may be one percent or less of the speed required for the latter.

As described above, it has been considered undesirable to employ the same structure to build TFTs for which operating conditions and required characteristics are greatly different.

SUMMARY OF THE INVENTION

It is an object of the present invention to optimize an active matrix circuit and peripheral circuits thereof by differentiating the structure of TFTs as the switching elements used in the active matrix circuit from that of TFTs used for CMOS logic circuits such as shift registers of the peripheral circuits.

Specifically, the source and drain of a TFT of an active matrix circuit are substantially doped with only one of two types of impurities, i.e., N-type and P-type impurities, whereas the source and drain of a TFT of a peripheral circuit which is of the same conductivity type as the TFT of the active matrix circuit are doped with both of N-type and P-type impurities.

If a TFT of the active matrix circuit is of the P-channel type, the source and drain thereof are doped with only P-type impurities. On the other hand, the source and drain of a P-channel type TFT of a peripheral circuit are doped with both of P-type and N-type impurities. Needless to say, in general, the density of P-type impurities is higher than that of N-type impurities.

The present invention is characterized in that the structure of a TFT is optimized using side walls formed on both sides of the gate electrode and a gate line thereof.

The side walls according to the present invention are formed by coating the gate electrode and gate line with an insulator film and by etching the film on an anisotropic basis. The substantially triangular insulators (side walls) formed on both sides of the gate electrode and gate line are used as masks during doping to form a low density drain (lightly doped drain, LDD) structure, an offset gate structure, and the like.

A process of providing an LDD through the formation of such side walls will be described with reference to FIG. 1. First, a crystalline semiconductor region 103 in the form of an island is formed on a substrate 101. An insulated base film 102 may be formed on the substrate. After depositing a gate-insulation film 104, a gate electrode 105 and a gate line 106 are formed using appropriate materials. As the materials for the gate electrode and gate line, materials which can be anodized, e.g., aluminum, may be used. (See FIG. 1A)

Thereafter, the semiconductor region is irradiated by accelerated ions of the doping impurities to form an impurity region 109 with the gate electrode 105 serving as a mask. If phosphorous is used as the doping impurities, an N-type impurity region is obtained and, if boron is used, a P-type impurity region is obtained. The conductivity of the impurities can be controlled by adjusting the densities and mixing ratio of those impurities. The amount of doping (dose) must be kept small in order to obtain an LDD structure. If no doping is performed, an offset gate structure is obtained. High density doping will provide normal source and drain. (See FIG. 1B)

The gate electrode and gate line may be anodized before doping to form an anodic oxide film 108. This anodic oxide film will serve as an etching stopper to protect the gate electrode during an anisotropic etching process to be performed later. The same effect can be obtained by forming a coating film such as a silicon nitride film on the gate electrode.

Thereafter, an insulator film 110 is formed to cover the gate electrode and gate line (and the anodic oxide film surrounding them). This film must be formed with sufficient coating properties and preferably has a thickness in the range of one-third to twice the height of the gate electrode and the gate line. For such a purpose, it is preferable to use a chemical vapor deposition (CVD) process such as a plasma CVD process, a low-pressure CVD process, and an atmospheric pressure CVD process. As a result, the thickness of the silicon nitride film is increased at the sides of the gate electrode and gate line as indicated by the dotted lines shown FIG. 1C.

The insulator formed as described above is subjected to anisotropic etching which proceeds with priority to etching in a direction substantially perpendicular to the substrate. This etching must be performed until the insulator film 110 is etched at flat portions and may be continued until the underlying gate insulation film is etched. This leaves substantially triangular insulators (side walls) 111 and 112 at the sides of the gate electrode and gate line because the insulator film has been made thicker in those areas than other areas. (See FIG. 1D)

Then, high density impurity doping is carried out using the side walls 111 and 112 as doping masks to form source and drain 114. LDD regions 113 are formed in the areas under the side walls because doping is not performed in those areas. (See FIG. 1E)

Thereafter, the impurities which have been doped are activated by means of thermal annealing, irradiation with intense light such as laser light or equivalents thereof (optical annealing) or the like. Further, after a layer insulator 115 is formed, a contact hole is formed in one or both of the source and drain of the TFT to form lines 116 and 117 for a second layer. (See FIG. 1F)

The above-described steps provide a TFT having an LDD structure. Although not true only for an LDD structure, the structure shown in FIG. 1 wherein the side walls 112 are provided on the sides of the gate line 106 is found to be effective for preventing the second layer wiring 117 from being cut at the steps it forms where it extends over the gate line 106 because the side walls 112 reduce the steepness of the steps.

An LDD structure and an offset gate structure can be provided as described above. According to the present invention, an LDD structure is employed for an N-channel type TFT for which a counter measure against hot carriers must-be taken, whereas a normal structure or an offset gate structure is employed for a P-channel type TFT for which such a counter measure is not required. According to the present invention, a TFT used for an active matrix circuit may be of either the N-channel type or P-channel type. However, a P-channel type TFT is preferred because it suffers less deterioration in characteristics. The present invention will be described below with reference to preferred embodiments thereof.

DETAILED DESCRIPTION OF THE PREFERRED EMBODIMENTS

Figure 1A:
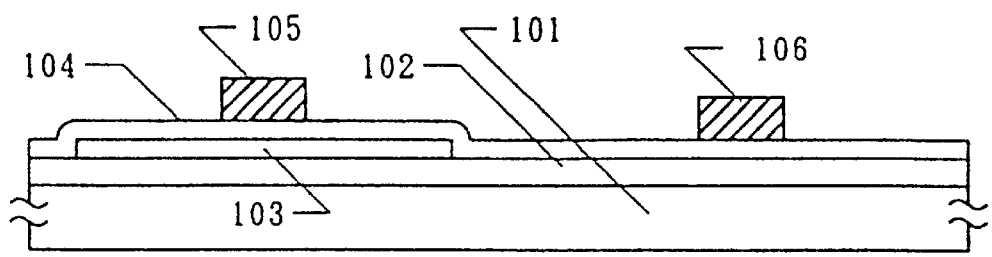
FIGS. 1A to 1F schematically illustrate the steps for forming side walls according to the present invention.
Figure 1B:
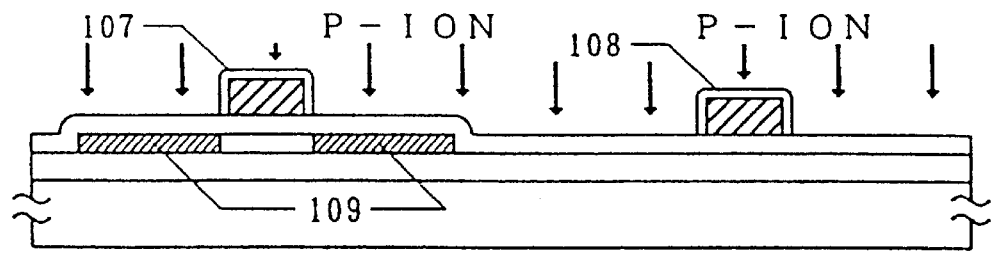

FIGS. 2A to 2G illustrate a first embodiment of the present invention. A silicon oxide film having a thickness of 1000 to 5000 Å, e.g., 2000 Å, is formed as a base oxide film 202 on a substrate (Corning 7059) 201. This oxide film is formed using a sputtering process in an oxygen atmosphere. For higher mass-productivity, it may be formed by decomposing and depositing TEOS (tetraethoxysilane) using a plasma CVD process. The silicon oxide film thus formed may be annealed at 400 to 650° C.

Thereafter, an amorphous silicon film is deposited using a plasma CVD process or LPCVD process to a thickness of 300 to 5000 Å, preferably 400 to 1000 A, e.g., 500 A. The film is then crystallized by keeping it in a reducing atmosphere at 550 to 600° C. for 8 to 24 hours. The crystallization may be accelerated (promoted) by adding a very small amount of metal element such as nickel which promotes the crystallization. Alternatively, this process may be carried out using laser irradiation. The resulting crystallized silicon film is etched to form island-like regions 203, 204, and 205.

The island-like regions 203 and 204 are regions in which TFTs of Peripheral circuits are formed and the island-like region 205 is a region in which a TFT of an active matrix circuit is formed. Further, a silicon oxide film 206 having a thickness of 700 to 1500 Å, e.g., 1200 Å is formed on those regions using a plasma CVD process.

Figure 2A:
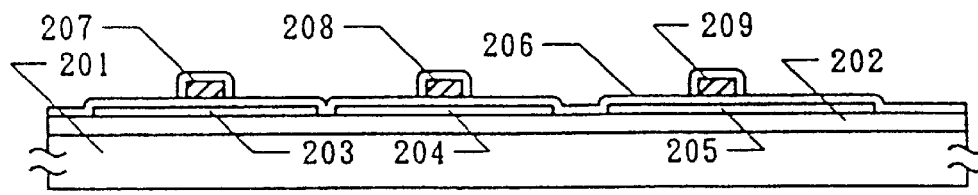
FIGS. 2A to 2G illustrate a method of fabricating TFT circuits according to a first embodiment of the present invention.

Thereafter, an aluminum (including Sc (scandium) of 0.1 to 0.5 percent by weight) film having a thickness of 1000 Å to 3 μm, e.g., 5000 Å is formed using a sputtering process and is etched to form gate electrodes 207, 208, and 209. Although not clear in the figure, all of the gate electrodes 207 through 209 are continuous to each other (FIG. 2A).

The gate electrodes 207 through 209 are anodized by applying a current to them in an electrolytic solution to form anodic oxide films having a thickness of 500 to 2500 Å, e.g., 2000 Å on the upper and side surfaces of the gate electrodes. The electrolytic solution used is obtained by diluting L-tartaric acid with ethylene glycol to a density of 5 percent and by adjusting the pH to 7.0±0.2 using ammonia. Other suitable solutions may be used instead. The substrate 201 is immersed in the electrolytic solution. The positive side of a constant current source is connected to a gate line on the substrate, and a platinum electrode is connected to the negative side. Thus, a voltage is applied with a constant current of 20 mA and oxidation is continued until the voltage reaches 150 V. The oxidation is further continued at a constant voltage of 150 V until the current decreases below 0.1 mA. As a result, an aluminum oxide film having a thickness of 2000 Å is obtained. After the anodizing process, electrical isolation is provided on the gate electrodes and gate line where necessary. Such an isolation process may be carried out in a later step.

Figure 2B:
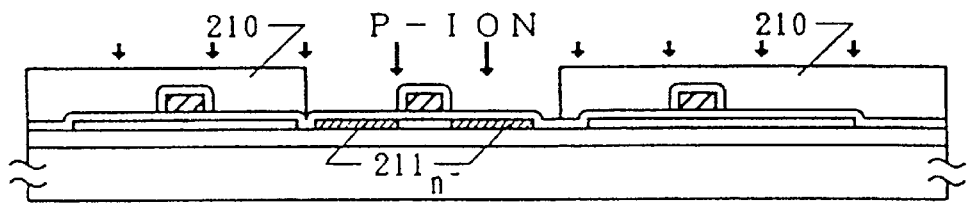
Figure 2C:
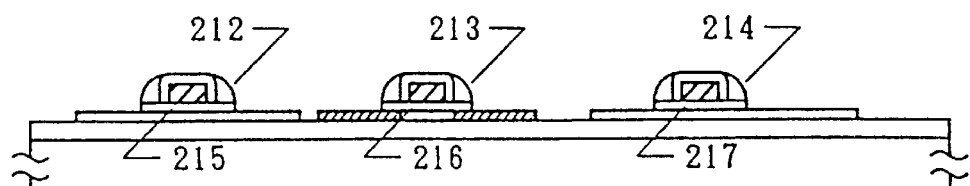
Figure 2D:
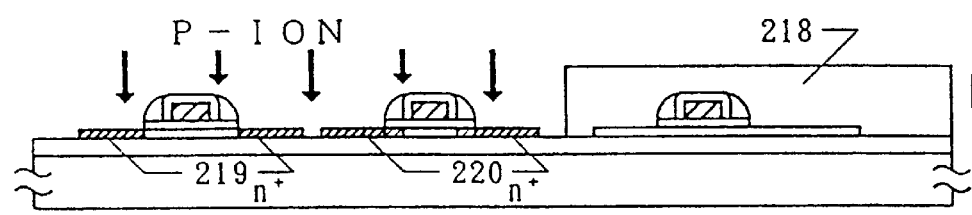
Figure 2E:
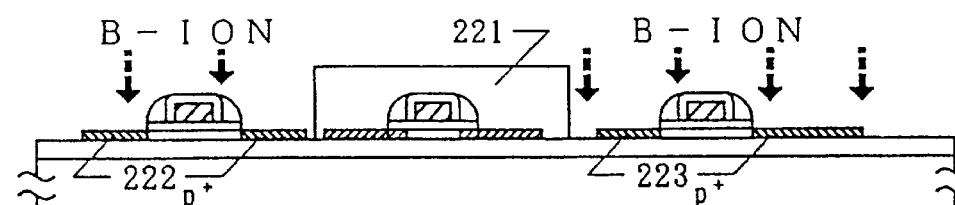
Figure 2F:
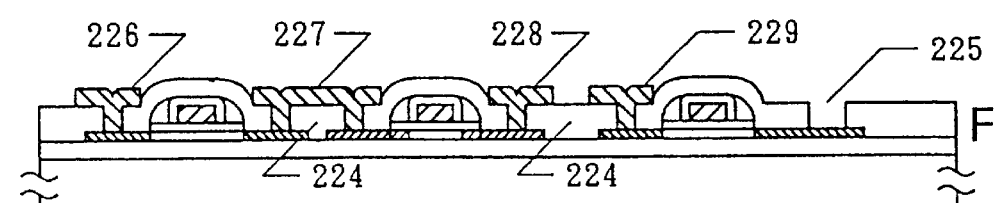
Figure 2G:
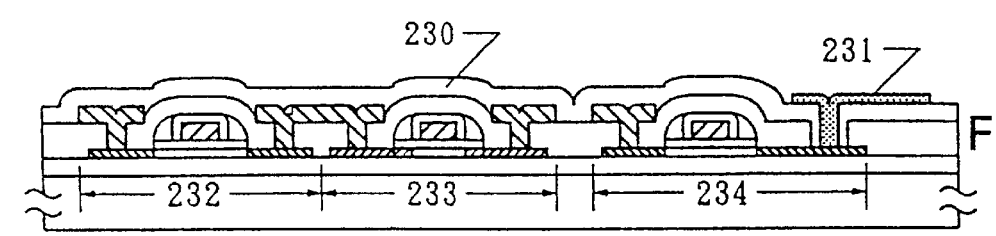

Thereafter, the regions 203 and 205 that constitute P-channel type TFTs are covered by photoresist masks 210. Phosphorous is implanted in the island-like silicon film 204 on a self-alignment basis using the gate electrode portion (i.e. the gate electrode and the anodic oxide film surrounding it) as a mask according to the ion implantation method to form an N-type low density impurity region (LDD) 211. The dose is $1 \times 10^{13}$ to $1 \times 10^{14}$ atoms/cm$^2$, and the acceleration voltage is 10 to 90 kV. For example, the dose is $2 \times 10^{13}$ atoms/cm$^2$, and the acceleration voltage is 80 kV (FIG. 2B).

Figure 1C:
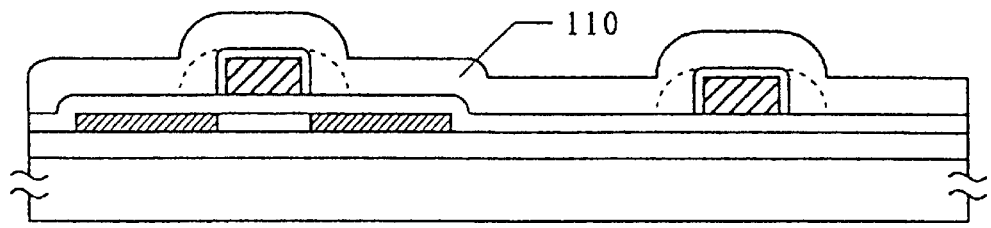

A silicon oxide film is then deposited as in the step shown at FIG. 1C using a plasma CVD process. The material gases used are TEOS and oxygen or monosilane and nitrous oxide. The optimum value for the thickness of the silicon oxide film depends on the height of the gate electrodes and gate lines. For example, in this embodiment wherein the height of the gate electrodes and gate lines including the anodic oxide films is about 6000 Å, the thickness is preferably 2000 Å to 1.2 μm which is one-third to twice the height and is set to 6000 Å in this embodiment. During this film forming step, the film thickness must be kept uniform in flat regions and good step-coverage must be provided.

Figure 1D:
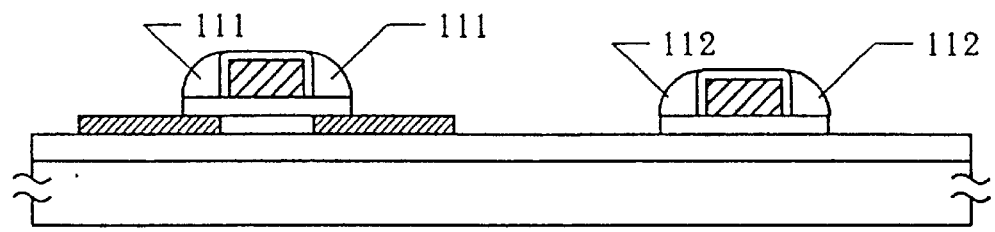
Figure 1E:
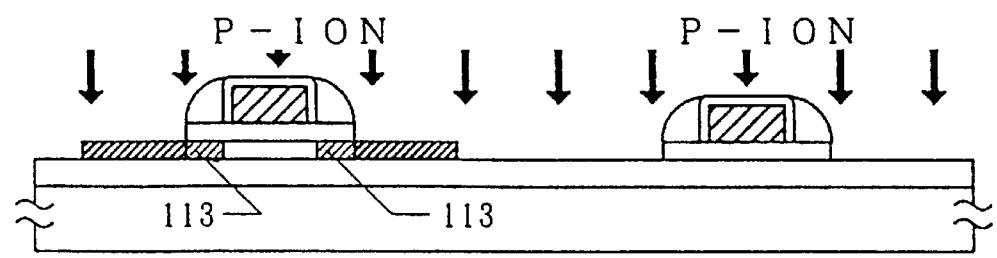
Figure 1F:
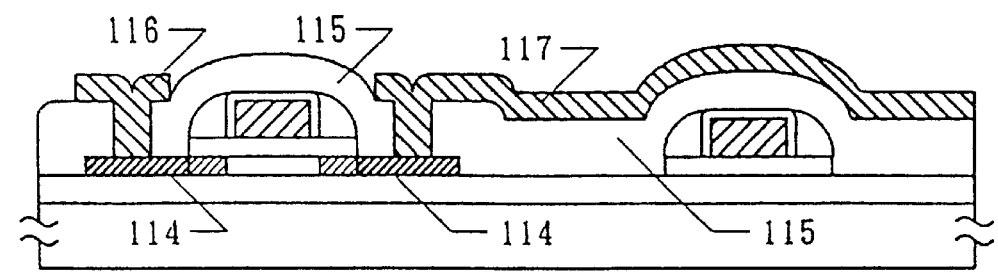

Next, anisotropic dry etching is performed according to the well-known RIE method as in the step indicated in FIG. 1D to etch the above-described silicon oxide film. In this etching step, the gate insulation film 206 is also etched. The steps described so far leave substantially triangular insulators (side walls) 212, 213, and 214 at the sides of the gate electrodes and gate line. Also, gate insulation films 215, 216, and 217 are left under the side walls and the gate electrode portions. (See FIG. 2C)

Figure 5:
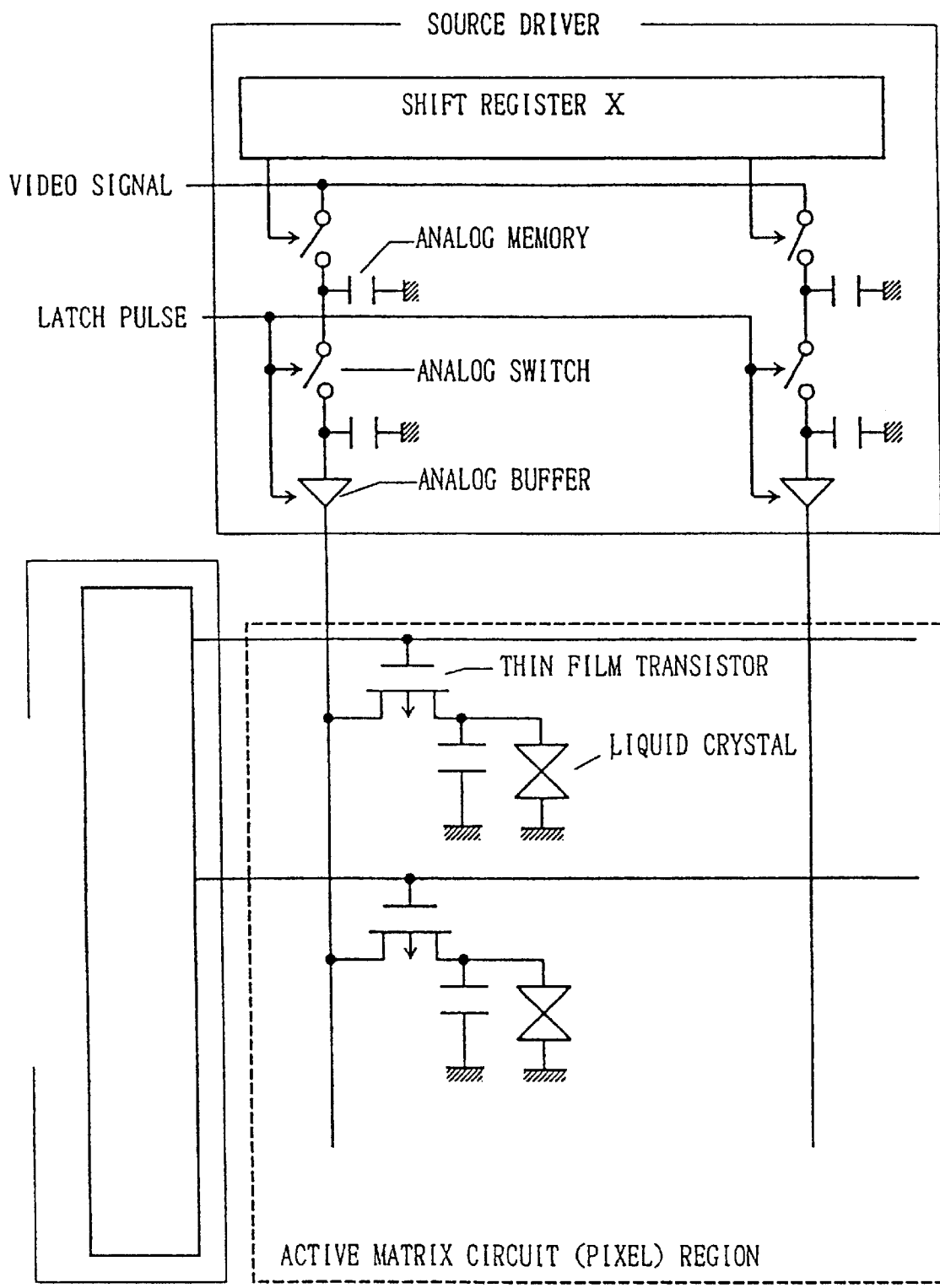
FIG. 5 is a block diagram of a monolithic active matrix circuit.

Thereafter, phosphorous is introduced again using an ion doping process. At this time, only the area of the active matrix circuit is covered by a photoresist mask 218. Since there are some spaces between the peripheral circuits and the active matrix circuit as apparent from FIG. 5, this patterning is relatively simple.

The dose in this doping step is greater than the dose employed at the step indicated by FIG. 2B by one to three figures. Further, since the gate insulation film has been etched, the optimum acceleration voltage is 10 to 30 kV. In the present embodiment, the dose is $1 \times 10^{15}$ atoms/cm$^2$ which is fifty times thne dose for the initial phosphorous doping. The acceleration voltage is set to 10 kV. As a result, regions (source and drain) 219 and 220 are formed which are doped with phosphorous at a high density. On the other hand, low density N-type regions are left under the side walls 213 and adjacent to the high density N-type regions 220. (See FIG. 2D.)

Next, boron is introduced using an ion doping process. In this case, the region 204 in which an N-channel type TFT is to be formed is covered by a photoresist mask 221. The dose is greater than the dose of phosphorous for the step shown at FIG. 2D because the N-type region 219 is inverted to the P-type. This embodiment employs a dose of $3 \times 10^{15}$ atoms/cm$^2$ which is three times the dose for the phosphorous doping at FIG. 2D. The acceleration voltage is set to 10 kV. As a result, the N-type region 219 is inverted to obtain a P-type region 222. The island-like region 205 is also doped with boron to form a P-type region (source/drain) 223. (See FIG. 2E)

Then, a KrF excimer laser beam having a wavelength of 248 nm and a pulse width of 20 ns is directed to the impurities doped to activate them (a laser annealing process).

The adequate energy density of the laser beam is 200 to 400 mJ/cm$^2$, preferably 250 to 300 mJ/cm$^2$. This laser irradiation step may be replaced by thermal annealing. Alternatively, the laser irradiation may be followed by thermal annealing.

A silicon oxide film is then formed on the entire surface as a layer insulation film 224 to a thickness of 5000 Å. Contact holes are formed in the sources and drains of the TFTs. Simultaneously, a contact hole 225 is formed in the impurity region of the TFT for the active matrix circuit at the side of a pixel electrode thereof. Then, aluminum lines and electrodes 226 through 229 for a second layer are formed. The thickness of the aluminum lines is substantially the same as that of the gate electrodes and gate lines, i.e., 4000 to 6000 Å. No metal wiring is provided in the contact hole 225. Referring now to the active matrix circuit, metal line 229 is a signal line, and the gate electrode 209 is connected to a gate line. (See FIG. 2F.)

Finally, a passivation film 230 constituted by a silicon nitride film is formed using a plasma CVD process. A contact hole is formed again in the position in which the contact hole 225 has been formed to expose the impurity region. An indium tin oxide (ITO) film which is a transparent conductive material is deposited using a sputtering process and is etched to form a pixel electrode 231.

The above-described steps provide an N-channel type thin film transistor 232 and a P-charnel type thin film transistor 233 for peripheral driver circuits and a P-channel type thin film transistor 234 for an active matrix circuit. As apparent from the above-described steps, both of the transistors 232 and 234 are P-channel transistors having an offset structure. However, the source and drain of the former are doped with both phosphorous and boron, whereas the source and drain of the latter are doped only with boron. The structure of the latter is advantageous especially wherein a high reverse bias voltage is applied as in the case of the switching element in an active matrix circuit.

A second embodiment of the present invention will now be described.

Figure 4A:
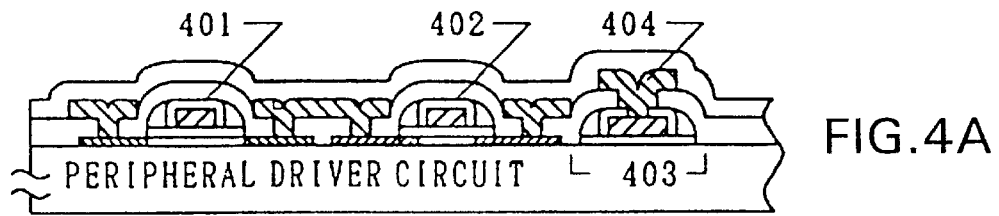
FIGS. 4A to 4F illustrate examples of TFT circuits according to third and fourth embodiments of the present invention.
Figure 4B:
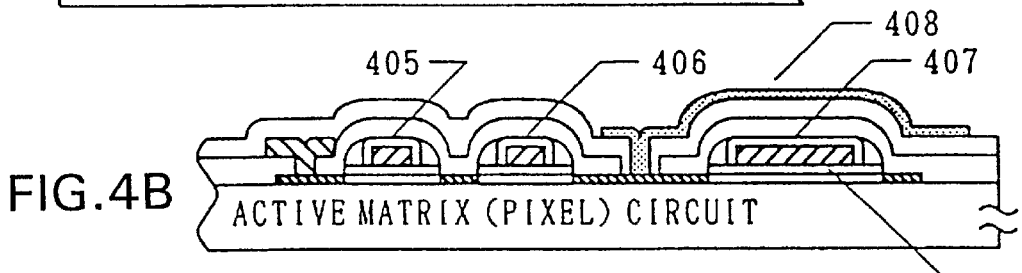
Figure 4C:
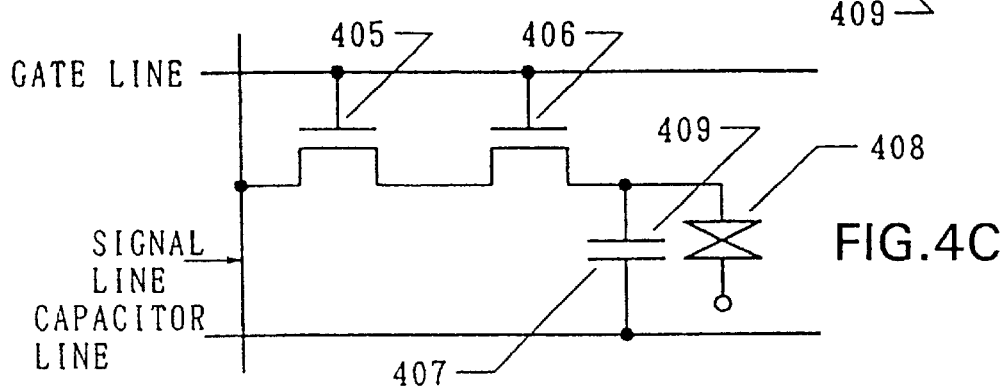

This embodiment relates to a monolithic active matrix circuit which is schematically shown FIGS. 4A to 4C. The elements in this embodiment are constructed in a manner which is basically the same as that in the first embodiment. The present embodiment is an improvement over the monolithic active matrix circuit shown at FIG. 2G.

Transistors 401 and 402 are of the N-channel type and P-channel type, respectively, and are both used in a peripheral driving circuit. The peripheral driving circuit has a contact portion 403 for establishing contact between the gate line and a line 404 of a second layer. The contact hole is formed in both of the layer insulator and anodic oxide. (See FIG. 4A)

A circuit diagram of a unit pixel of the active matrix circuit is shown in FIG. 4C. The present embodiment employs a double gate circuit wherein transistors 405 and 406 are connected in series as a switching element. A line 407 which extends in the same layer as the gate electrodes are formed on an island-like region to which a pixel electrode 408 is connected to form an auxiliary capacity 407 with the gate insulation film serving as a dielectric. The line 407 is kept at a constant voltage as a capacity line so that a MOS capacity is established between it and the island-like region. (See FIGS. 4B and 4C.)

FIGS. 3A to 3G illustrate a third embodiment of the present invention. Crystalline island-like silicon regions 303, 304, and 305 are formed on a substrate 301 on which a silicon oxide film having a thickness of 2000 Å is formed as a base oxide film 302. In addition, a silicon oxide film 306 having a thickness of 1200 Å is formed thereon using a plasma CVD process. The island-like regions 303 and 304 represent TFTs for peripheral circuits of the active matrix circuit, whereas the island-like region 305 represents a region in which a TFT for the active matrix circuit is formed. Further, aluminum gate electrodes 307, 308, and 309 are formed which are 5000 Å thick and are anodized on the side and upper surfaces thereof. (See FIG. 3A)

Figure 3A:
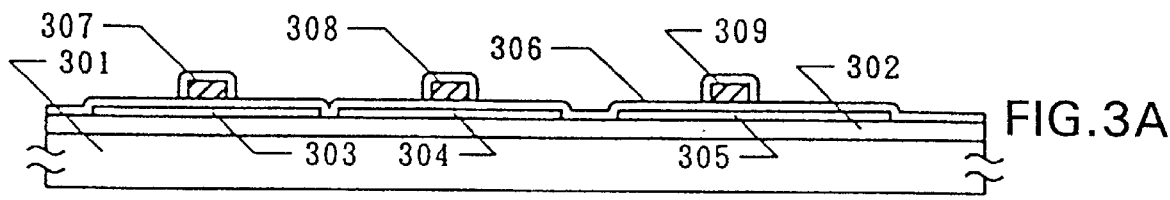
FIGS. 3A to 3G illustrate a method of fabricating TFT circuits according to a second embodiment of the present invention.
Figure 3B:
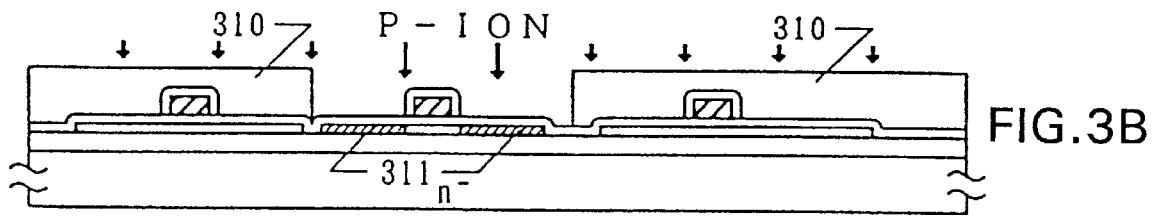

Thereafter, the regions 303 and 305 in which P-channel type TFTs are to be formed are covered with photoresist masks 310. Phosphorous is implanted in the island-like silicon film 304 on a self-aligrment basis using the gate electrode portion as a mask according to the ion doping method to form low density N-type regions 311 . The doping is carried out with a dose of $2 \times 10^{13}$ atoms/cm$^2$ and an acceleration voltage of 80 kV. (FIG. 3B)

Figure 3C:
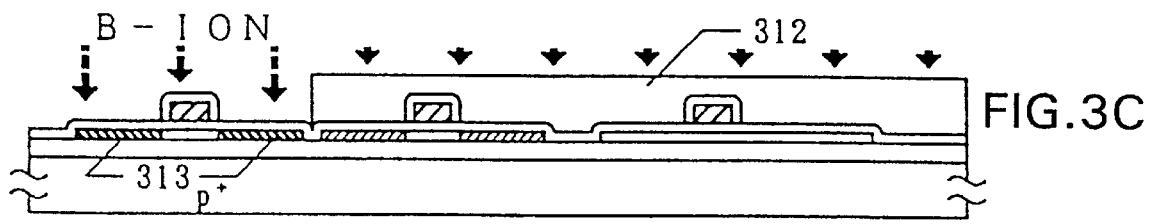
Figure 3D:
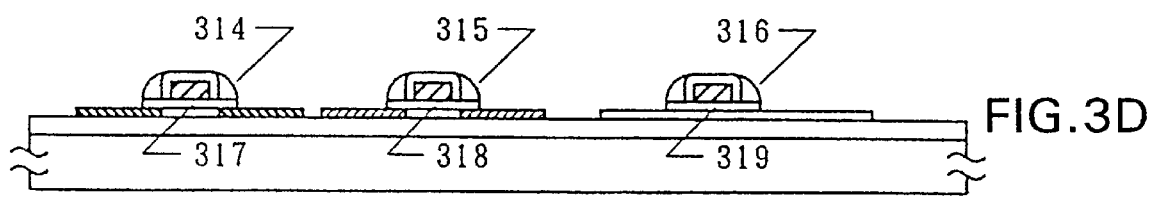
Figure 3E:
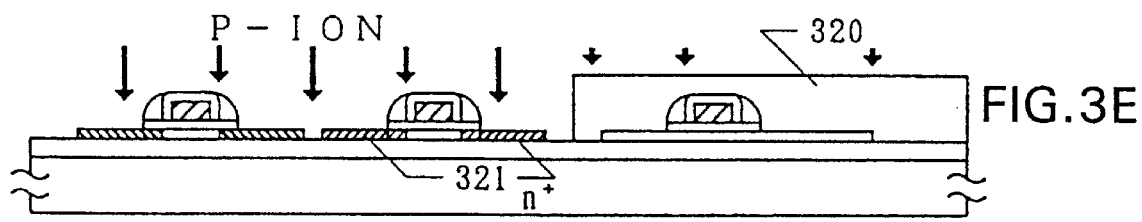
Figure 3F:
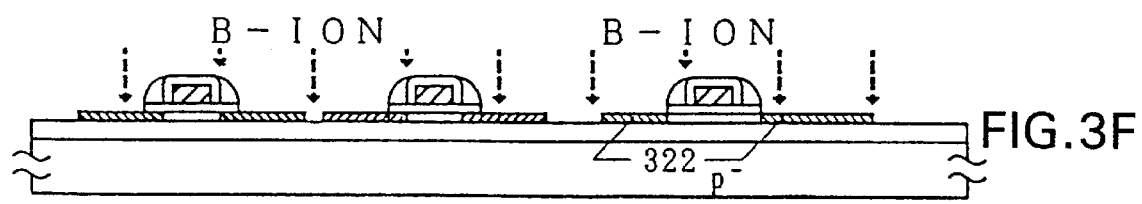
Figure 3G:
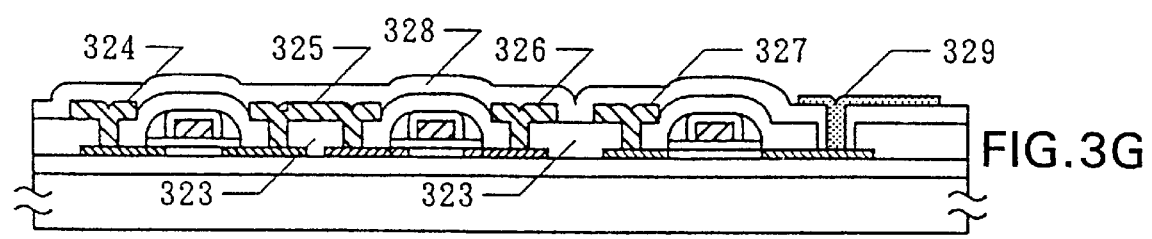

Next, the region 304 and the active matrix region 305 in which N-channel type TFTs are to be formed are covered with a photoresist mask 310. Phosphorous is implanted in the island-like silicon film 303 on a self-alignment basis using the gate electrode portion as a mask according to the ion doping method to form high density P-type regions 311. The doping is carried out with a dose of $3\times10^{15}$ atoms/cm$^2$ and an acceleration voltage of 60 kV. (FIG. 3C)

Side walls 314, 315, and 316 are formed at the sides of the gate electrodes 307 through 309 through the steps as shown in FIGS. 1A to 1F. Gate insulation films 317, 318, and 319 are left under the side walls and the gate electrodes. (See FIG. 3D)

Thereafter, phosphorous is introduced again using an ion doping process. At this time, only the area of the active matrix circuit is covered by a photoresist mask 320. The dose in this step is greater than the dose employed at FIG. 3B by one to three figures. Further, since the gate insulation film has been etched, the optimum acceleration voltage is 10 to 30 kV. In the present embodiment, the dose is $1\times10^{15}$ atoms/cm$^2$ which is fifty times the dose for the initial phosphorous doping. The acceleration voltage is set to 10 kV. As a result, N-type regions (source and drain) 321 are formed which are doped with phosphorous at high density. On the other hand, a region 313 which has been doped with boron remains as a P-type region because the dose of boron is greater than the dose of phosphorous. Further, the areas of the region 313 under the side walls 314 are not doped with phosphorous at all. Low density N-type regions are left under the side walls 315 and adjacent to the high density N-type regions 321. (See FIG. 3E)

Next, low density boron is introduced using an ion doping process after removing the photoresist mask 320. The dose in this case is preferable smaller than the dose for the above-described boron doping by one to three figures. The present embodiment employs a dose of $3\times10^{13}$ atoms/cm$^2$ which is 1/100 of the dose for the boron doping at FIG. 3C. The acceleration voltage is set to 10 kV. As a result, a low density P-type region 322 is formed in the island-like region 305 which constitutes the TFT of the active matrix circuit. (See FIG. 3F)

Further, a RrF excimer laser beam having a wavelength of 248 nm and a pulse width of 20 ns is directed to the impurities doped to activate them (a laser annealing process).

The adequate energy density of the laser beam is 200 to 400 mJ/cm$^2$, preferably 250 to 300 mJ/cm$^2$. This laser irradiation step may be replaced by thermal annealing. Alternatively, the laser irradiation may be followed by thermal annealing.

Finally, as in the first embodiment, layer insulators 323, metal lines 324 though 327, a passivation film 328, and an ITO pixel electrode 329 are formed. (See FIG. 3G)

The above-described steps provide an N-channel type thin film transistor and a P-channel type thin film transistor for peripheral driver circuits and a P-channel type thin film transistor 234 for an active matrix circuit. As apparent from the above-described steps, the N-channel type TFT for the peripheral circuit has an LDD structure. As to the P-channel type TFTs, the TFT for the peripheral circuit has a normal structure, while the TFT for the active matrix circuit is an offset gate type TFT. In addition, the source and drain of the TFT for the active matrix circuit are doped only at a low density.

Such a structure is idealistic for use in a switching element in an active matrix circuit. The offset gate structure reduces leak current (also referred to as OFF current) which is generated when a reverse bias voltage is applied to the gate electrode, thereby suppressing leakage of the electrical charge stored in the pixel cell. Additionally, the low impurity density at the source and drain prevents the deterioration of characteristics caused by the application of a reverse bias current.

On the other hand, since high speed operations are desired for peripheral circuits, normal TFTs as illustrated are preferred.

A fourth embodiment of the present invention will now be described.

Figure 4D:
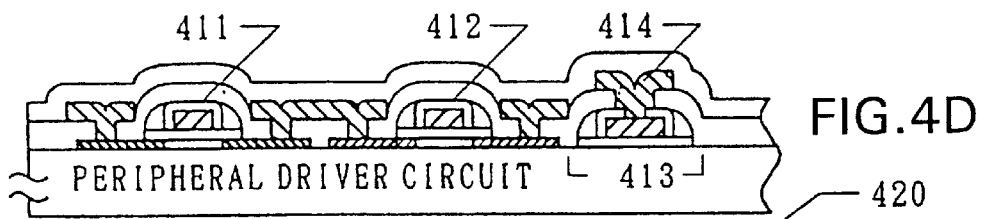
Figure 4E:
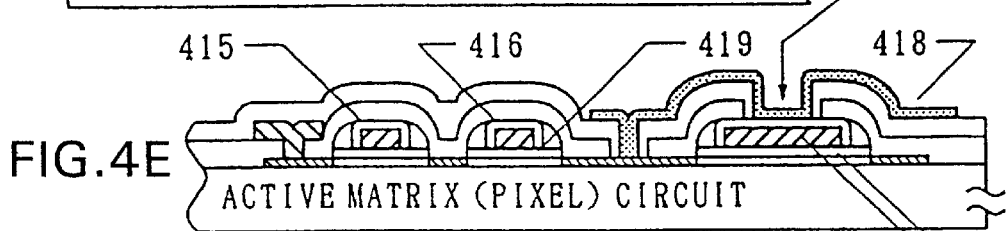
Figure 4F:
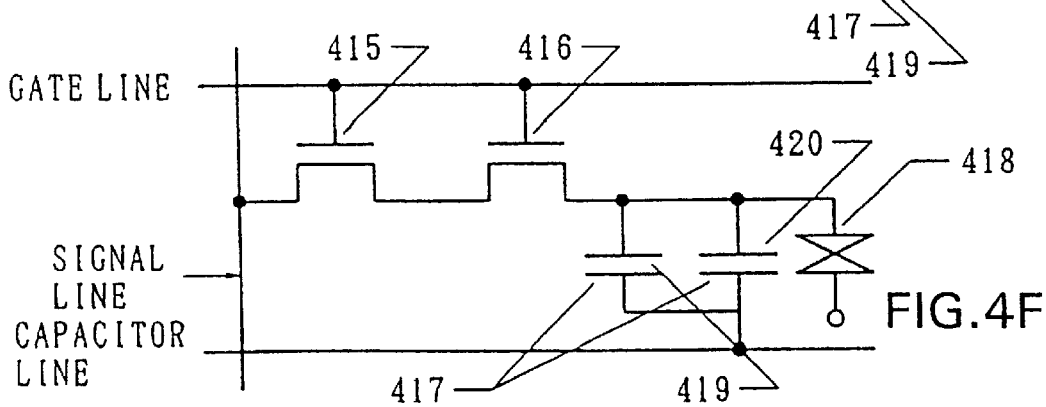

This embodiment relates to a monolithic active matrix circuit which is schematically shown in FIGS. 4D to 4F. The elements in this embodiment are constructed in a manner which is basically the same as that in the third embodiment. The present embodiment is an improvement over the monolithic active matrix circuit shown in FIG. 3G.

Transistors 411 and 412 are of the N-channel type and P-channel type, respectively, and are both used in a peripheral driving circuit. The peripheral driving circuit has a contact hole 413 for establishing contact between the gate line and a line 414 of a second layer. The contact hole is formed in both of the layer insulator and anodic oxide. (See FIG. 4D)

A circuit diagram of a unit pixel of the active matrix circuit is shown in FIG. 4F. In the present embodiment, transistors 415 and 416 are connected in series as a switching element. Like the second embodiment, a MOS capacity 419 is formed by an island-like region and a line 417. In addition, a capacity 420 is established between the pixel electrode and the line 417 by etching a passivation film and the later insulator and using the anodic oxide as a dielectric. As in the second embodiment, the line 417 is kept at a constant voltage as a capacity line. (See FIGS. 4E and 4F)

According to the present invention, there is proposed a TFT which exhibits characteristics and reliability required for each of the circuits that constitute a monolithic active matrix circuit, thereby improving the display characteristics of the matrix circuit.

Various modifications to the present invention will become apparent to those skilled in the art from the foregoing description and accompanying drawings. Accordingly, the present invention is to be limited solely by the scope of the following claims.

I claim:

1. A semiconductor device comprising at least an active matrix region and a peripheral circuit, (a) said active matrix region comprising:
    a semiconductor island formed over a substrate;
    at least first and second thin film transistors formed with said semiconductor island, each of which includes a channel region in said semiconductor island and a gate electrode adjacent to said channel region;
    a signal line bormed over said substrate and connected to said first thin film transistor;
    a pixel electrode connected to said second thin film transistor wherein said first and second thin film transistors are connected in series between said signal line and said pixel electrode; and
    a capacitor forming electrode formed adjacent to a potion of said semiconductor island to form a capacitor therebetween, and (b) said peripheral circuit comprising:
    at least one CMOS circuit comprising a pair of an N-channel thin film transistor and a P-channel thin film transistor over said substrate, each of said an N-channel thin film transistor and a P-channel thin film transistor comprising:

a semiconductor island over said substrate, said semiconductor island having a channel region, and source and drain regions;
a gate insulating film adjacent to said semiconductor island; and
a gate electrode adjacent to said semiconductor island with said gate insulating film interposed therebetween,
wherein said semiconductor island of at least said N-channel thin film transistor comprises a pair of LDD regions between said channel region and said source and drain regions.

2. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region in said semiconductor island and a gate electrode over said channel region;
a signal line formed over said substrate and connected to said first thin film transistor;
a pixel electrode connected to said second thin film transistor wherein said first and second thin film transistors are connected in series between said signal line and said pixel electrode; and
a capacitor forming electrode formed over a potion of said semiconductor island to form a capacitor therebetween, and
(b) said peripheral circuit comprising:
at least one CMOS circuit comprising a pair of an N-channel thin film transistor and a P-channel thin film transistor over said substrate, each of said an N-channel thin film transistor and a P-channel thin film transistor comprising:
a semiconductor island over said substrate, said semiconductor island having a channel region, and source and drain regions;
a gate insulating film adjacent to said semiconductor island; and
a gate electrode over said semiconductor island with said gate insulating film interposed therebetween,
wherein said semiconductor island of at least said N-channel thin transistor comprises a pair of LDD regions between said channel region and said source and drain regions.

3. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region in said semiconductor island and a gate electrode adjacent to said channel region;
a signal line firmed over said substrate and connected to said first thin film transistor;
a pixel electrode connected to said second thin film transistor wherein said first and second thin film transistors are connected in series between said signal line and said pixel electrode;
a capacitor forming electrode formed adjacent to a potion of said semiconductor island to form a capacitor therebetween,
wherein a contact of said semiconductor island to said pixel electrode is located between said portion of the semiconductor island and said second thin film transistor;

(b) said peripheral circuit comprising:
at least one CMOS circuit comprising a pair of an N-channel thin film transistor and a P-channel thin film transistor over said substrate.

4. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region in said semiconductor island and a gate electrode over said channel region;
a signal line formed over said substrate and connected to said first thin film transistor;
a pixel electrode connected to said second thin film transistor wherein said first and second thin film transistors are connected in series between said signal line and said pixel electrode;
a capacitor forming electrode formed over a potion of said semiconductor island to form a capacitor therebetween,
wherein a contact of said semiconductor island to said pixel electrode is located between said portion of the semiconductor island and said second thin film transistor;
(b) said peripheral circuit comprising:
at least one CMOS circuit comprising a pair of an N-channel thin film transistor and a P-channel thin film transistor over said substrate.

5. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region and impurity regions in said semiconductor island and a gate electrode adjacent to said channel region;
a signal line formed over said substrate and connected to said first thin film transistor;
a pixel electrode connected to said second thin film transistor wherein said first and second thin film transistors are connected in series between said signal line and said pixel electrode;
a capacitor forming electrode formed adjacent to a potion of said semiconductor island to form a capacitor therebetween,
wherein said portion is surrounded by at least two of said impurity regions in said semiconductor island, and
(b) said peripheral circuit comprising:
at least one CMOS circuit comprising a pair of an N-channel thin film transistor and a P-channel thin film transistor over said substrate.

6. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region and impurity regions in said semiconductor island and a gate electrode over said channel region;
a signal line formed over said substrate and connected to said first thin film transistor;
a pixel electrode connected to said second thin film transistor wherein said first and second thin film transistors are connected in series between said signal line and said pixel electrode;

a capacitor forming electrode formed over a potion of said semiconductor island to form a capacitor therebetween, wherein said portion is surrounded by at least two of said impurity regions in said semiconductor island, and (b) said peripheral circuit comprising:

at least one CMOS circuit comprising a pair of an N-channel thin film transistor and a P-channel thin film transistor over said substrate.

7. A semiconductor device comprising at least an active matrix region and a peripheral circuit, (a) said active matrix region comprising:

a semiconductor island formed over a substrate;

at least first and second thin film transistors formed with said semiconductor island, each of which includes a channel region in said semiconductor island and a gate electrode adjacent to said channel region;

a gate line formed over said substrate and connected to said gate electrodes of said fist and second thin transistors;

a signal line formed over said substrate and connected to said first thin film transistor;

a pixel electrode connected to said second thin film transistor wherein said first and second thin film transistors are connected in series between said signal line and said pixel electrode;

a capacitor forming electrode formed adjacent to a potion of said semiconductor island to form a capacitor therebetween, wherein said gate line is parallel to said capacitor forming electrode in said active matrix region, and (b) said peripheral circuit comprising:

at least one CMOS circuit comprising a pair of an N-channel thin film transistor and a P-channel thin film transistor over said substrate.

8. A semiconductor device comprising at least an active matrix region and a peripheral circuit, (a) said active matrix region comprising:

a semiconductor island formed over a substrate;

at least first and second thin film transistors formed with said semiconductor island, each of which includes a channel region in said semiconductor island and a gate electrode over said channel region;

a gate line formed over said substrate and connected to said gate electrodes of said fist and second thin transistors;

a signal line formed over said substrate and connected to said first thin film transistor;

a pixel electrode connected to said second thin film transistor wherein said first and second thin film transistors are connected in series between said signal line and said pixel electrode;

a capacitor forming electrode formed over a potion of said semiconductor island to form a capacitor therebetween, wherein said gate line is parallel to said capacitor forming electrode in said active matrix region, and (b) said peripheral circuit comprising:

at least one CMOS circuit comprising a pair of an N-channel thin film transistor and a P-channel thin film transistor over said substrate.

9. A semiconductor device comprising at least an active matrix region and a peripheral circuit, (a) said active matrix region comprising:

a semiconductor island formed over a substrate;

at least first and second thin film transistors formed with said semiconductor island, each of which includes a channel region in said semiconductor island and a gate electrode adjacent to said channel region;

a signal line formed over said substrate and connected to said first thin film transistor;

a pixel electrode connected to said second thin film transistor wherein said first and second thin film transistors are connected in series between said signal line and said pixel electrode;

a capacitor forming electrode formed adjacent to a potion of said semiconductor island to form a capacitor therebetween, wherein said source line and said capacitor forming electrode cross at right angles in said active matrix region, and (b) said peripheral circuit comprising:

at least one CMOS circuit comprising a pair of an N-channel thin film transistor and a P-channel thin film transistor over said substrate.

10. A semiconductor device comprising at least an active matrix region and a peripheral circuit, (a) said active matrix region comprising:

a semiconductor island formed over a substrate;

at least first and second thin film transistors formed with said semiconductor island, each of which includes a channel region in said semiconductor island and a gate electrode over said channel region;

a signal line formed over said substrate and connected to said first thin film transistor;

a pixel electrode connected to said second thin film transistor wherein said first and second thin film transistors are connected in series between said signal line and said pixel electrode;

a capacitor forming electrode formed over a potion of said semiconductor island to form a capacitor therebetween, wherein said source line and said capacitor forming electrode cross at right angles in said active matrix region, and (b) said peripheral circuit comprising:

at least one CMOS circuit comprising a pair of an N-channel thin film transistor and a P-channel thin film transistor over said substrate.

11. A semiconductor device comprising at least an active matrix region and a peripheral circuit, (a) said active matrix region comprising:

a semiconductor island on an insulating surface of a substrate, said semiconductor island comprising at least first and second channel regions, and a plurality of impurity regions;

a gate insulating film adjacent to said semiconductor island;

at least first and second gate electrodes adjacent to said first and second channel regions with said gate insulating film interposed therebetween, respectively;

a capacitor forming electrode adjacent to said semiconductor island with said gate insulating film interposed therebetween; and a pixel electrode connected with said semiconductor island, and (b) said peripheral circuit comprising:
   at least one CMOS circuit comprising a pair of an N-channel thin film transistor and a P-channel thin film transistor on said insulating surface of said substrate, each of said an N-channel thin film transistor and a P-channel thin film transistor comprising:
      a semiconductor island on said insulating surface of said substrate, said semiconductor island having a channel region, and source and drain regions;
      a gate insulating film adjacent to said semiconductor island; and
      a gate electrode adjacent to said semiconductor island with said gate insulating film interposed therebetween,
      wherein said semiconductor island of at least said N-channel thin transistor comprises a pair of LDD repions located between said channel region and said source and drain regions, respectively.

12. A semiconductor device comprising at least an active matrix region and a peripheral circuit,
   (a) said active matrix region comprising:
      a semiconductor island on an insulating surface of a substrate, said semiconductor island comprising at least first and second channel regions, and a plurality of impurity regions;
      a gate insulating film on said semiconductor island;
      at least first and second gate electrodes over said first and second channel regions with said gate insulating film interposed therebetween, respectively;
      a capacitor forming electrode over said semiconductor island with said gate insulating film interposed therebetween; and
      a pixel electrode connected with said semiconductor island, and
   (b) said peripheral circuit comprising:
      at least one CMOS circuit comprising a pair of an N-channel thin film transistor and a P-channel thin film transistor on said insulating surface of said substrate, each of said an N-channel thin film transistor and a P-channel thin film transistor comprising:
         a semiconductor island on said insulating surface of said substrate, said semiconductor island having a channel region, and source and drain regions;
         a gate insulating film on said semiconductor island; and
         a gate electrode over said semiconductor island with said gate insulating film interposed therebetween,
         wherein said semiconductor island of at least said N-channel thin transistor comprises a pair of LDD regions between said channel region and said source and drain regions, respectively.

13. A semiconductor device comprising at least an active matrix region and a peripheral circuit,
   (a) said active matrix region comprising:
      a semiconductor island on an insulating surface of a substrate, said semiconductor island comprising at least first and second channel regions, and a plurality of impurity regions;
      a gate insulating film adjacent to said semiconductor island;
      at least first and second gate electrodes adjacent to said first and second channel regions with said gate insulating film interposed therebetween, respectively;
      a capacitor forming electrode adjacent to said semiconductor island with said gate insulating film interposed therebetween; and
      a pixel electrode connected with said semiconductor island,
      wherein said pixel electrode is in contact with a region of said semiconductor island, said region located between a portion under said capacitor forming electrode and one of said impurity regions in said semiconductor island, and
   (b) said peripheral circuit comprising:
      at least one CMOS circuit comprising a pair of an N-channel thin film transistor and a P-channel thin film transistor on said insulating surface of said substrate.

14. A semiconductor device comprising at least an active matrix region and a peripheral circuit,
   (a) said active matrix region comprising:
      a semiconductor island on an insulating surface of a substrate, said semiconductor island comprising at least first and second channel regions, and a plurality of impurity regions;
      a gate insulating film on said semiconductor island;
      at least first and second gate electrodes over said first and second channel regions with said gate insulating film interposed therebetween, respectively;
      a capacitor forming electrode over said semiconductor island with said gate insulating film interposed therebetween; and
      a pixel electrode connected with said semiconductor island,
      wherein said pixel electrode is in contact with a region of said semiconductor island, said region located between a portion under said capacitor forming electrode and one of said impurity regions in said semiconductor island, and
   (b) said peripheral circuit comprising:
      at least one CMOS circuit comprising a pair of an N-channel thin film transistor and a P-channel thin film transistor on said insulating surface of said substrate.

15. A semiconductor device comprising at least an active matrix region and a peripheral circuit,
   (a) said active matrix region comprising:
      a semiconductor island on an insulating surface of a substrate, said semiconductor island comprising at least first and second channel regions, and a plurality of impurity regions;
      a gate insulating film adjacent to said semiconductor island;
      at least first and second gate electrodes adjacent to said first and second channel regions with said gate insulating film interposed therebetween, respectively;
      a capacitor forming electrode adjacent to a portion in said semiconductor island with said gate insulating film interposed therebetween; and
      a pixel electrode connected with said semiconductor island,
      wherein said portion is surrounded by at least two of said impurity regions in said semiconductor island, and
   (b) said peripheral circuit comprising:
      at least one CMOS circuit comprising a pair of an N-channel thin film transistor and a P-channel thin film transistor on said insulating surface of said substrate.

16. A semiconductor device comprising at least an active matrix region and a peripheral circuit, (a) said active matrix region comprising:
  a semiconductor island on an insulating surface of a substrate, said semiconductor island comprising at least first and second channel regions, and a plurality of impurity regions;
  a gate insulating film on said semiconductor island;
  at least first and second gate electrodes over said first and second channel regions with said gate insulating film interposed therebetween, respectively;
  a capacitor forming electrode over a portion in said semiconductor island with said gate insulating film interposed therebetween; and
  a pixel electrode connected with said semiconductor island,
  wherein said portion is surrounded by at least two of said impurity regions in said semiconductor island, and
(b) said peripheral circuit comprising:
  at least one CMOS circuit comprising a pair of an N-channel thin film transistor and a P-channel thin film transistor on said insulating surface of said substrate.

17. A semiconductor device comprising at least an active matrix region and a peripheral circuit,
(a) said active matrix region comprising:
  a semiconductor island on an insulating surface of a substrate, said semiconductor island comprising at least first and second channel regions, and a plurality of impurity regions;
  a gate insulating film adjacent to said semiconductor island;
  at least first and second gate electrodes adjacent to said first and second channel regions with said gate insulating film interposed therebetween, respectively;
  a gate line connected to said first and second gate electrodes;
  a capacitor forming electrode adjacent to a portion in said semiconductor island with said gate insulating film interposed therebetween; and
  a pixel electrode connected with said semiconductor island,
  wherein said gate line is parallel to said capacitor forming electrode in said active matrix region, and
(b) said peripheral circuit comprising:
  at least one CMOS circuit comprising a pair of an N-channel thin film transistor and a P-channel thin film transistor on said insulating surface of said substrate.

18. A semiconductor device comprising at least an active matrix region and a peripheral circuit,
(a) said active matrix region comprising:
  a semiconductor island on an insulating surface of a substrate, said semiconductor island comprising at least first and second channel regions, and a plurality of impurity regions;
  a gate insulating film on said semiconductor island;
  at least first and second gate electrodes over said first and second channel regions with said gate insulating film interposed therebetween, respectively;
  a gate line connected to said first and second gate electrodes;
  a capacitor forming electrode over a portion in said semiconductor island with said gate insulating film interposed therebetween; and
  a pixel electrode connected with said semiconductor island,
  wherein said gate line is parallel to said capacitor forming electrode in said active matrix region, and
(b) said peripheral circuit comprising:
  at least one CMOS circuit comprising a pair of an N-channel thin film transistor and a P-channel thin film transistor on said insulating surface of said substrate.

19. A semiconductor device comprising at least an active matrix region and a peripheral circuit,
(a) said active matrix region comprising:
  a semiconductor island on an insulating surface of a substrate, said semiconductor island comprising at least first and second channel regions, and a plurality of impurity regions;
  a gate insulating film adjacent to said semiconductor island;
  at least first and second gate electrodes adjacent to said first and second channel regions with said gate insulating film interposed therebetween, respectively;
  a capacitor forming electrode adjacent to a portion in said semiconductor island with said gate insulating film interposed therebetween;
  a source line connected to said semiconductor island; and
  a pixel electrode connected with said semiconductor island,
  wherein said source line and said capacitor forming electrode cross at right angles in said active matrix region, and
(b) said peripheral circuit comprising:
  at least one CMOS circuit comprising a pair of an N-channel thin film transistor and a P-channel thin film transistor on said insulating surface of said substrate.

20. A semiconductor device comprising at least an active matrix region and a peripheral circuit,
(a) said active matrix region comprising:
  a semiconductor island on an insulating surface of a substrate, said semiconductor island comprising at least first and second channel regions, and a plurality of impurity regions;
  a gate insulating film on said semiconductor island;
  at least first and second gate electrodes over said first and second channel regions with said gate insulating film interposed therebetween, respectively;
  a capacitor forming electrode over a portion in said semiconductor island with said gate insulating film interposed therebetween;
  a source line connected to said semiconductor island; and
  a pixel electrode connected with said semiconductor island,
  wherein said source line and said capacitor forming electrode cross at right angles in said active matrix region, and
(b) said peripheral circuit comprising:
  at least one CMOS circuit comprising a pair of an N-channel thin film transistor and a P-channel thin film transistor on said insulating surface of said substrate.

21. A semiconductor device comprising at least an active matrix region and a peripheral circuit,
(a) said active matrix region comprising:
  a gate line connected to at least first and second gate electrodes formed over a substrate;

a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode adjacent to a portion in said semiconductor island,
wherein said portion in the semiconductor island is a same conductivity type as said first and second channel regions, and
(b) said peripheral circuit comprising:
at least one CMOS circuit comprising a pair of an N-channel thin film transistor and a P-channel thin film transistor over said substrate, each of said an N-channel thin film transistor and a P-channel thin film transistor comprising:
a semiconductor island over said substrate, said semiconductor island having a channel region, and source and drain regions;
a gate insulating film adjacent to said semiconductor island; and
a gate electrode adjacent to said semiconductor island with said gate insulating film interposed therebetween,
wherein said semiconductor island of at least said N-channel thin transistor comprises a pair of LDD regions located between said channel region and said source and drain regions, respectively.

22. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions under said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode over a portion in said semiconductor island,
wherein said portion in the semiconductor island is a same conductivity type as said first and second channel regions, and
(b) said peripheral circuit comprising:
at least one CMOS circuit comprising a pair of an N-channel thin film transistor and a P-channel thin film transistor on said insulating surface of said substrate, each of said an N-channel thin film transistor and a P-channel thin film transistor comprising:
a semiconductor island over said substrate, said semiconductor island having a channel region, and source and drain regions;
a gate insulating film on said semiconductor island; and
a gate electrode over said semiconductor island with said gate insulating film interposed therebetween,
wherein said semiconductor island of at least said N-channel thin transistor comprises a pair of LDD regions between said channel region and said source and drain regions, respectively.

23. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode adjacent to a portion in said semiconductor island,
wherein said portion in the semiconductor island is a same conductivity type as said first and second channel regions, and
wherein said pixel electrode is in contact with said third impurity region, said third impurity region located between said second channel region and said portion in said semiconductor island, and
(b) said peripheral circuit comprising:
at least one CMOS circuit comprising a pair of an N-channel thin film transistor and a P-channel thin film transistor over said substrate.

24. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions under said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and a capacitor forming electrode over a portion in said semiconductor island,
wherein said portion in the semiconductor island is a same conductivity type as said first and second channel regions, and
wherein said pixel electrode is in contact with said third impurity region, said third impurity region located between said second channel region and said portion in said semiconductor island, and
(b) said peripheral circuit comprising:
at least one CMOS circuit comprising a pair of an N-channel thin film transistor and a P-channel thin film transistor over said substrate.

25. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions,
a third impurity region located adjacent to second channel region, and
a fourth impurity region located at one of ends of said semiconductor island,
wherein said first, second, third, and fourth impurity regions have a same conductivity type impurity; and
a capacitor forming electrode adjacent to a portion in said semiconductor island, said portion are a same conductivity type as said first and second channel regions,
wherein said portion is interposed between said third and fourth impurity regions, and
(b) said peripheral circuit comprising:
at least one CMOS circuit comprising a pair of an N-channel thin film transistor and a P-channel thin film transistor over said substrate.

26. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions under said first and said second gate electrodes, respectively,
a first impurity region located adjacent to said first channel forming region and connected to said signal line,
a second impurity region located between said first and second channel regions,
a third impurity region located adjacent to second channel region, and
a fourth impurity region located at one of ends of said semiconductor island,
wherein said first, second, third, and fourth impurity regions have a same conductivity type impurity; and
a capacitor forming electrode over a portion in said semiconductor island, wherein said portion of said semiconductor island is a same conductivity type as said first and second channel regions,
wherein said portion is interposed between said third and fourth impurity regions, and
(b) said peripheral circuit comprising:
at least one CMOS circuit comprising a pair of an N-channel thin film transistor and a P-channel thin film transistor over said substrate.

27. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode adjacent to a portion in said semiconductor island,
wherein said portion in said semiconductor island is a same conductivity type as said first and second channel regions, and
wherein said gate line is parallel to said capacitor forming electrode in said active matrix region, and
(b) said peripheral circuit comprising:
at least one CMOS circuit comprising a pair of an N-channel thin film transistor and a P-channel thin film transistor over said substrate.

28. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions under said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode over a portion in said semiconductor island,
wherein said portion in said semiconductor island is a same conductivity type as said first and second channel regions, and
wherein said gate line is parallel to said capacitor forming electrode in said active matrix region, and (b) said peripheral circuit comprising:
- at least one CMOS circuit comprising a pair of an N-channel thin film transistor and a P-channel thin film transistor over said substrate.

29. A semiconductor device comprising at least an active matrix region and a peripheral circuit,
- (a) said active matrix region comprising:
  - a gate line connected to at least first and second gate electrodes formed over a substrate;
  - a signal line formed over said substrate;
  - a pixel electrode formed over said substrate;
  - a semiconductor island formed over said substrate, said semiconductor island having at least:
    - first and second channel regions adjacent to said first and said second gate electrodes, respectively,
    - a first impurity region located adjacent to said first channel forming region and connected to said signal line,
    - a second impurity region located between said first and second channel regions, and
    - a third impurity region located adjacent to second channel region,
    - wherein said first, second, and third impurity regions have a same conductivity type impurity; and
  - a capacitor forming electrode adjacent to a portion in said semiconductor island,
    - wherein said portion in said semiconductor island a same conductivity type as said first and second channel regions,
    - wherein said source line and said capacitor forming electrode cross at right angles in said active matrix region, and
- (b) said peripheral circuit comprising:
  - at least one CMOS circuit comprising a pair of an N-channel thin film transistor and a P-channel thin film transistor over said substrate.

30. A semiconductor device comprising at least an active matrix region and a peripheral circuit,
- (a) said active matrix region comprising:
  - a gate line connected to at least first and second gate electrodes formed over a substrate;
  - a signal line formed over said substrate;
  - a pixel electrode formed over said substrate;
  - a semiconductor island formed over said substrate, said semiconductor island having at least:
    - first and second channel region under said first and said second gate electrodes, respectively,
    - a first impurity region located adjacent to said first channel forming region and connected to said signal line,
    - a second impurity region located between said first and second channel regions, and
    - a third impurity region located adjacent to second channel region,
    - wherein said first, second, and third impurity regions have a same conductivity type impurity; and
  - a capacitor forming electrode over a portion in said semiconductor island,
    - wherein said portion in said semiconductor island a same conductivity type as said first and second channel regions,
    - wherein said source line and said capacitor forming electrode cross at right angles in said active matrix region, and
- (b) said peripheral circuit comprising:
  - at least one CMOS circuit comprising a pair of an N-channel thin film transistor and a P-channel thin film transistor over said substrate.

* * * * *

(12) REEXAMINATION CERTIFICATE (4813th)
United States Patent
Suzawa

(10) Number: US 5,998,841 C1
(45) Certificate Issued: *Jul. 15, 2003

(54) SEMICONDUCTOR DEVICE INCLUDING ACTIVE MATRIX CIRCUIT

(75) Inventor: Hideomi Suzawa, Kanagawa (JP)

(73) Assignee: Semiconductor Energy Laboratory Co., Ltd., Atsugi (JP)

Reexamination Request:
No. 90/005,692, Apr. 3, 2002

Reexamination Certificate for:
Patent No.: 5,998,841
Issued: Dec. 7, 1999
Appl. No.: 09/166,157
Filed: Oct. 5, 1998

(*) Notice: This patent is subject to a terminal disclaimer.

Related U.S. Application Data

(62) Division of application No. 08/961,807, filed on Oct. 31, 1997, now Pat. No. 5,856,689, which is a division of application No. 08/807,001, filed on Mar. 10, 1997, now Pat. No. 5,712,495, which is a continuation of application No. 08/471,101, filed on Jun. 6, 1995, now abandoned.

(30) Foreign Application Priority Data

Jun. 13, 1994 (JP) ................................. 6-154177

(51) Int. Cl.⁷ .................. H01L 27/01; H01L 27/12; H01L 31/0392
(52) U.S. Cl. ............... 257/350; 257/59; 257/71; 257/72; 257/296; 257/351; 257/379
(58) Field of Search .............. 257/59, 71, 72, 257/350, 351, 296, 379

(56) References Cited

U.S. PATENT DOCUMENTS

| | | |
|---|---|---|
| 5,250,931 A | 10/1993 | Misawa et al. |
| 5,274,279 A | 12/1993 | Misawa et al. |
| 5,341,012 A | 8/1994 | Misawa et al. |

(List continued on next page.)

FOREIGN PATENT DOCUMENTS

| | | |
|---|---|---|
| EP | 0 342 925 | 11/1988 |
| EP | 0 379 366 | 7/1990 |
| EP | 0 604 006 A2 | 6/1994 |
| JP | 58-093092 | 6/1983 |
| JP | 63-121886 | 5/1988 |
| JP | 64-081262 | 3/1989 |
| JP | 01-274116 | 11/1989 |
| JP | 1-289917 | 11/1989 |
| JP | 02-044317 | 2/1990 |
| JP | 2-189522 | 7/1990 |
| JP | 02-224284 | 9/1990 |
| JP | 3-142418 | 6/1991 |
| JP | 03-274029 | 12/1991 |
| JP | 03-288824 | 12/1991 |
| JP | 04-000415 | 1/1992 |
| JP | 04-170067 | 6/1992 |
| JP | 04-195123 | 7/1992 |
| JP | 04-344618 | 12/1992 |
| JP | 05-027258 | 2/1993 |
| JP | 05-034718 | 2/1993 |
| JP | 05-061057 | 3/1993 |
| JP | 5-267667 | 10/1993 |
| JP | 05-297411 | 11/1993 |
| JP | 06-035004 | 2/1994 |
| JP | 06-077252 | 3/1994 |
| JP | 6-95157 | 4/1994 |
| JP | 06-095147 | 4/1994 |
| JP | 06-097441 | 4/1994 |
| JP | 6-102531 | 4/1994 |
| JP | 6-250212 | 9/1994 |
| JP | 7-335903 | 12/1995 |

*Primary Examiner*—Ngan V. Ngo

(57) ABSTRACT

There is provided a combination of doping process and use of side walls which allows the source and drain of a thin film transistor of an active matrix circuit to be doped with only one of N-type and P-type impurities and which allows the source and drain of a thin film transistor used in a peripheral circuit of the same conductivity type as that of the thin film transistor of the active matrix circuit to include both of N-type and P-type impurities. Also, a thin film transistor in an active matrix circuit has offset regions by using side walls, and another thin film transistor in a peripheral circuit has a lightly doped region by using side walls.

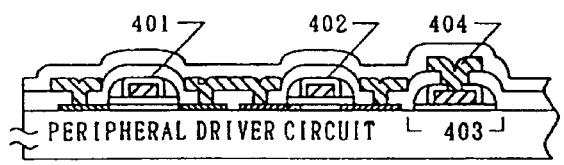

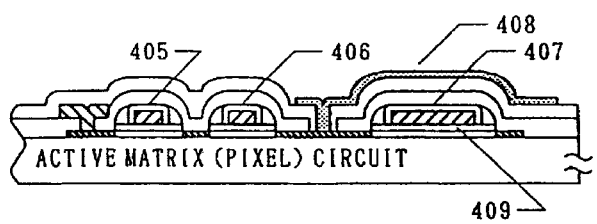

U.S. PATENT DOCUMENTS

| | | |
|---|---|---|
| 5,359,206 A | 10/1994 | Yamamoto et al. |
| 5,403,762 A | 4/1995 | Takemura |
| 5,410,164 A | 4/1995 | Katayama et al. |
| 5,463,483 A | 10/1995 | Yamazaki |
| 5,499,123 A | 3/1996 | Mikoshiba |
| 5,572,046 A | 11/1996 | Takemura |
| 5,576,857 A | 11/1996 | Takemura |
| 5,583,347 A | 12/1996 | Misawa et al. |
| 5,591,990 A | 1/1997 | Misawa et al. |
| 5,608,251 A | 3/1997 | Konuma et al. |
| 5,616,936 A | 4/1997 | Misawa et al. |
| 5,620,905 A | 4/1997 | Konuma et al. |
| 5,627,084 A | 5/1997 | Yamazaki et al. |
| 5,648,685 A | 7/1997 | Misawa et al. |
| 5,656,826 A | 8/1997 | Misawa et al. |
| 5,677,212 A | 10/1997 | Misawa et al. |
| 5,686,328 A | 11/1997 | Zhang et al. |
| 5,712,495 A | 1/1998 | Suzawa |
| 5,714,771 A | 2/1998 | Misawa et al. |
| 5,736,750 A | 4/1998 | Yamazaki et al. |
| 5,754,158 A | 5/1998 | Misawa et al. |
| 5,767,930 A | 6/1998 | Kobayashi et al. |
| 5,780,872 A | 7/1998 | Misawa et al. |
| 5,811,837 A | 9/1998 | Misawa et al. |
| 5,856,689 A | 1/1999 | Suzawa |
| 5,904,511 A | 5/1999 | Misawa et al. |
| 5,939,731 A | 8/1999 | Yamazaki et al. |
| 5,998,841 A | 12/1999 | Suzawa |
| 6,096,581 A | 8/2000 | Zhang et al. |

US 5,998,841 C1

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 15, 16, 25, and 26 is confirmed.

Claims 1–14, 17–24 and 27–30 are determined to be patentable as amended.

New claim 31 is added and determined to be patentable.

1. A semiconductor device comprising at least an active matrix region and a peripheral circuit,
   (a) said active matrix region comprising:
      a semiconductor island formed over a substrate;
      at least first and second thin film transistors formed with said semiconductor island, each of which includes a channel region in said semiconductor island and a gate electrode adjacent to said channel region;
      a signal line [bormed] *formed* over said substrate and connected to said first thin film transistor;
      a pixel electrode connected to said second thin film transistor wherein said first and second thin film transistors are connected in series between said signal line and said pixel electrode; and
      a capacitor forming electrode formed adjacent to a [potion] *portion* of said semiconductor island to form a capacitor therebetween, [and]
      *wherein said portion is surrounded by at least two impurity regions in said semiconductor island and*
   (b) said peripheral circuit comprising:
      at least one CMOS circuit comprising a pair of an N-channel thin film transistor and a P-channel thin film transistor over said substrate, each of said an N-channel thin film transistor and a P-channel thin film transistor comprising:
         a semiconductor island over said substrate, said semiconductor island having a channel region, and source and drain regions;
         a gate insulating film adjacent to said semiconductor island; and
         a gate electrode adjacent to said semiconductor island with said gate insulating film interposed therebetween,
         wherein said semiconductor island of at least said N-channel thin transistor comprises a pair of LLD regions between said channel region and said source and drain regions.

2. A semiconductor device comprising at least an active matrix region and a peripheral circuit,
   (a) said active matrix region comprising:
      a semiconductor island formed over a substrate;
      at least first and second thin film transistors formed with said semiconductor island, each of which includes a channel region in said semiconductor island and a gate electrode over said channel region;
      a signal line formed over said substrate and connected to said first thin film transistor;
      a pixel electrode connected to said second thin film transistor wherein said first and second thin film transistors are connected in series between said signal line and said pixel electrode; and
      a capacitor forming electrode formed over a [potion] *portion* of said semiconductor island to form a capacitor therebetween, [and]
      *wherein said portion is surrounded by at least two impurity regions in said semiconductor island, and*
   (b) said peripheral circuit comprising:
      at least one CMOS circuit comprising a pair of an N-channel thin film transistor and a P-channel thin film transistor over said substrate, each of said an N-channel thin film transistor and a P-channel thin film transistor comprising:
         a semiconductor island over said substrate, and semiconductor island having a channel region, and source and drain regions;
         a gate insulating film adjacent to said semiconductor island; and
         a gate electrode over said semiconductor island with said gate insulating film interposed therebetween,
         wherein said semiconductor island of at least said N-channel thin transistor comprises a pair of LDD regions between said channel region and said source and drain regions.

3. A semiconductor device comprising at least an active matrix region and a peripheral circuit,
   (a) said active matrix region comprising:
      a semiconductor island formed over a substrate;
      at least first and second thin film transistors formed with said semiconductor island, each of which includes a channel region in said semiconductor island and a gate electrode adjacent to said channel region;
      a signal line formed over said substrate and connected to said first thin film transistor;
      a pixel electrode connected to said second thin film transistor wherein said first and second thin film transistors are connected in series between said signal line and said pixel electrode;
      a capacitor forming electrode formed adjacent to a [potion] *portion* of said semiconductor island to form a capacitor therebetween,
      wherein a contact of said semiconductor island to said pixel electrode is located between said portion of the semiconductor island and said second thin film transistor;
      *wherein said portion is a same conductivity type as said channel region, and*
   (b) said peripheral circuit comprising:
      at least one CMOS circuit comprising a pair of an N-channel thin film transistor and a P-channel thin film transistor over said substrate.

4. A semiconductor device comprising at least an active matrix region and a peripheral circuit,
   (a) said active matrix region comprising:
      a semiconductor island formed over a substrate;
      at least first and second thin film transistors formed with said semiconductor island, each of which includes a channel region in said semiconductor island and a gate electrode over said channel region;
      a signal line formed over said substrate and connected to said first thin film transistor;
      a pixel electrode connected to said second thin film transistor wherein said first and second thin film transistors are connected in series between said signal line and said pixel electrode;
a capacitor forming electrode formed over a [potion] *portion* of said semiconductor island to form a capacitor therebetween,
wherein a contact of said semiconductor island to said pixel electrode is located between said portion of the semiconductor island and said second thin film transistor;
*wherein said portion is a same conductivity type as said channel region and*
(b) said peripheral circuit comprising:
at least one CMOS circuit comprising a pair of an N-channel thin film transistor and a P-channel thin film transistor over said substrate.

5. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region and impurity regions in said semiconductor layer and a gate electrode adjacent to said channel region;
a signal line formed over said substrate and connected to said first thin film transistor;
a pixel electrode connected to said second thin film transistor wherein said first and second thin film transistors are connected in series between said signal line and said pixel electrode;
a capacitor forming electrode formed adjacent to a [potion] *portion* of said semiconductor island to form a capacitor therebetween,
wherein said portion is surrounded by at least two of said impurity regions in said semiconductor island, and
(b) said peripheral circuit comprising:
at least one CMOS circuit comprising a pair of an N-channel thin film transistor and a P-channel thin film transistor over said substrate.

6. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region and impurity regions in said semiconductor layer and a gate electrode over said channel region;
a signal line formed over said substrate and connected to said first thin film transistor;
a pixel electrode connected to said second thin film transistor wherein said first and second thin film transistors are connected in series between said signal line and said pixel electrode;
a capacitor forming electrode formed over a [potion] *portion* of said semiconductor island to form a capacitor therebetween,
wherein said portion is surrounded by at least two of said impurity regions in said semiconductor island, and
(b) said peripheral circuit comprising:
at least one CMOS circuit comprising a pair of an N-channel thin film transistor and a P-channel thin film transistor over said substrate.

7. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region in said semiconductor island and a gate electrode adjacent to said channel region;
a gate line formed over said substrate and connected to said gate electrodes of said [fist] *first* and second thin transistors;
a signal line formed over said substrate and connected to said first thin film transistor;
a pixel electrode connected to said second thin film transistor wherein said first and second thin film transistors are connected in series between said signal line and said pixel electrode;
a capacitor forming electrode formed adjacent to a [potion] *portion* of said semiconductor island to form a capacitor therebetween, *and connected to a capacitor line,*
wherein said gate line is parallel to said capacitor [forming electrode] *line* in said active matrix region, [and]
*wherein said portion is surrounded by at least two impurity regions in said semiconductor island and*
(b) said peripheral circuit comprising:
at least one CMOS circuit comprising a pair of an N-channel thin film transistor and a P-channel thin film transistor over said substrate.

8. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region is said semiconductor layer and a gate electrode over said channel region;
a gate line formed over said substrate and connected to said gate electrodes of said [fist] *first* and second thin transistors;
a signal line formed over said substrate and connected to said first thin film transistor;
a pixel electrde connected to said second thin film transistor wherein said first and second thin film transistors are connected in series between said signal line and said pixel electrode;
a capacitor forming electrode formed over a [potion] *portion* of said semiconductor island to form a capacitor therebetween, *and connected to a capacitor line,*
wherein said gate line is parallel to said capacitor [forming electrode] *line* in said active matrix region, [and]
*wherein said portion is surrounded by at least two impurity regions in said semiconductor island, and*
(b) said peripheral circuit comprising:
at least one CMOS circuit comprising a pair of an N-channel thin film transistor and a P-channel thin film transistor over said substrate.

9. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region in said semiconductor layer and a gate electrode adjacent to said channel region;
a signal line formed over said substrate and connected to said first thin film transistor;
a pixel electrode connected to said second thin film transistor wherein said first and second thin film transistors are connected in series between said signal line and said pixel electrode;
a capacitor forming electrode formed adjacent to a [potion] *portion* of said semiconductor island to form a capacitor therebetween, *and connected to a capacitor line,*
wherein said [source] *signal* line and said capacitor [forming electrode] *line* cross at right angels in said active matrix region, [and]
*wherein said portion is a same conductivity type as said channel region, and*
(b) said peripheral circuit comprising:
at least one CMOS circuit comprising a pair of an N-channel thin film transistor and a P-channel thin film transistor over said substrate.

10. A semiconductor device comprising at least an active matrix region and a peripheral circuit,
(a) said active matrix region comprising:
a semiconductor island formed over a substrate;
at least first and second thin film transistors formed with said semiconductor island, each of which includes a channel region in said semiconductor layer and a gate electrode over said channel region;
a signal line formed over said substrate and connected to said first thin film transistor;
a pixel electrode connected to said second thin film transistor wherein said first and second thin film transisors are connected in series between said signal line and said pixel electrode;
a capacitor forming electrode formed over a [potion] *portion* of said semiconductor island to form a capacitor therebetween, *and connected to a capacitor line,*
wherein said [source] *signal* line and said capacitor [forming electrode] *line* cross at right angles in said active matrix region, [and]
*wherein said portion is a same conductivity type as said channel region, and*
(b) said peripheral circuit comprising:
at least one CMOS circuit comprising a pair of an N-channel thin film transistor and a P-channel thin transistor over said substrate.

11. A semiconductor device comprising at least an active matrix region and a peripheral circuit,
(a) said active matrix region comprising;
a semiconductor island on an insulating surface of a substrate, said semiconductor island comprising at least first and second channel regions, and a plurality of impurity regions;
a gate insulating film adjacent to said semiconductor island;
at least first and second gate electrodes adjacent to said first and second channel regions with said gate insulating film interposed therebetween, resectively;
a capacitor forming electrode adjacent to *a portion of* said semiconductor island with said gate insulating film interposed therebetween; and
a pixel electrode connected with said semiconductor island, [and ]
*wherein said portion is a same conductivity type as said first and second channel regions, and*
(b) said peripheral circuit comprising;
at least one CMOS circuit comprising a pair of an N-channel thin film transistor and a P-channel thin film transistor on said insulating surface of said substrate, each of said an N-channel thin film transistor and a P-channel thin film transistor comprising:
a semiconductor island on said insulating surface of said substrate, said semiconductor island having a channel region, and source and drain regions;
a gate insulating film adjacent to said semiconductor island; and
a gate electrode adjacent to said semiconductor island with said gate insulating film interposed therebetween,
wherein said semiconductor island of [at least]said N-channel thin transistor comprises a pair of LDD [repions] *regions* located between said channel region and said source and drain regions, respectively[.], *and*
*wherein said semiconductor island of said P-channel thin film transistors has no LDD regions.*

12. A semiconductor device comprising at least an active matrix region and a peripheral circuit,
(a) said active matrix region comprising:
a semiconductor island on an insulating surface of a substrate, said semiconductor island comprising at least first and second channel regions, and a plurality of impurity regions;
a gate insulating film on said semiconductor island;
at least first and second gate electrodes over said first and second channel regions with said gate insulating film interposed therebetween, respectively;
a capacitor forming electrode over *a portion of* said semiconductor island with said gate insulating film interposed therebetween; and
a pixel electrode connected with said semiconductor island, [and]
*wherein said portion is a same conductivity type as said first and second channel regions, and*
(b) said peripheral circuit comprising:
at least one CMOS circuit comprising a pair of an N-channel thin film transistor and a P-channel thin film transistor on said insulating surface of said substrate, each of said an N-channel thin film transistor and a P-channel thin film transistor comprising:
a semiconductor island on said insulating surface of said substrate, said semiconductor island having a channel region, and source and drain regions;
a gate insulating film on said semiconductor island, and
a gate electrode over said semiconductor island with said gate insulating film interposed therebetween,
wherein said semiconductor island of [at least] said N-channel thin transistor comprises a pair of LDD regions between said channel region and said source and drain regions, respectively, *and*
*wherein said semiconductor island of said P-channel thin film transistors has no LDD regions.*

13. A semiconductor device comprising at least an active matrix region and a peripheral circuit,
(a) said active matrix region comprising:
a semiconductor island on an insulating surface of a substrate, said semiconductor island comprising at least first and second channel regions, and a plurality of impurity regions;
a gate insulating film adjacent to said semiconductor island;
at least first and second gate electrodes adjacent to said first and second channel regions with said gate insulating film interposed therebetween, respectively;
a capacitor forming electrode adjacent to *a portion of* said semiconductor island with said gate insulating film interposed therebetween; and
a pixel electrode connected with said semiconductor island, wherein said pixel electrode is in contact with a region of said semiconductor island, said region located between a portion under said capacitor forming electrode and one of said impurity regions in said semiconductor island, [and]

*wherein said portion is a same conductivity type as said first and second channel regions, and*

(b) said peripheral circuit comprising:

at least one CMOS circuit comprising a pair of an N-channel thin film transistor and a P-channel thin film transistor on said insulating surface of said substrate.

14. A semiconductor device comprising at least an active matrix region and a peripheral circuit, (a) said active matrix region comprising:

a semiconductor island on an insulating surface of a substrate, said semiconductor island comprising at least first and second channel regions, and a plurality of impurity regions;

a gate insulating film on said semiconductor island;

at least first and second gate electrodes over said first and second channel regions with said gate insulating film interposed therebetween, respectively;

a capacitor forming electrode over said semiconductor island with said gate insulating film interposed therebetween; and a pixel electrode connected with said semiconductor island, wherein said pixel electrode is in contact with a region of said semiconductor island, said region located between a portion under said capacitor forming electrode and one of said impurity regions in said semiconductor island, [and]

*wherein said portion is a same conductivity type as said first and second channel regions, and*

(b) said peripheral circuit comprising:

at least one CMOS circuit comprising a pair of an N-channel thin film transistor and a P-channel thin film transistor on said insulating surface of said substrate.

17. A semiconductor device comprising at least an active matrix region and a peripheral circuit, (a) said active matrix region comprising:

a semiconductor island on an insulating surface of a substrate, said semiconductor island comprising at least first and second channel regions, and a plurality of impurity regions;

a gate insulating film adjacent to said semiconductor island;

at least first and second gate electrodes adjacent to said first and second channel regions with said gate insulating film interposed therebetween, respectively;

a gate line connected to said first and second gate electrodes;

a capacitor forming electrode adjacent to a portion in said semiconductor island with said gate insulating film interposed therebetween *connected to a capacitor line*; and a pixel electrode connected with said semiconductor island, wherein said gate line is parallel to said capacitor [forming electrode] *line* in said active matrix region, [and]

*wherein said portion is a same conductivity as said first and second channel regions, and*

(b) said peripheral circuit comprising:

at least one CMOS circuit comprising a pair of an N-channel thin film transistor and a P-channel thin film transistor on said insulating surface of said substrate,

*wherein said N-channel thin film transistor has at least one LDD region and said P-channel thin film transistor has no LDD region.*

18. A semiconductor device comprising at least an active matrix region and a peripheral circuit, (a) said active matrix region comprising:

a semiconductor island on an insulating surface of a substrate, said semiconductor island comprising at least first and second channel regions, and a plurality of impurity regions;

a gate insulating film on said semiconductor island;

at least first and second gate electrodes over said first and second channel regions with said gate insulating film interposed therebetween, respectively, a gate line connected to said first and second gate electrodes;

a capacitor forming electrode over a portion in said semiconductor island with said gate insulating film interposed therebetween *connected to a capacitor line;* and a pixel electrode connected with said semiconductor island, wherein said gate line is parallel to said capacitor [forming electrode] *line* in said active matrix region, [and]

*wherein said portion is a same conductivity as said first and second channel regions, and*

(b) said peripheral circuit comprising:

at least one CMOS circuit comprising a pair of an N-channel thin film transistor and a P-channel thin film transistor on said insulating surface of said substrate,

*wherein said N-channel thin film transistor has at least one LDD region and said P-channel thin film transistor has no LDD region.*

19. A semiconductor device comprising at least an active matrix region and a peripheral circuit, (a) said active matrix region comprising:

a semiconductor island on an insulating surface of a substrate, said semiconductor island comprising at least first and second channel regions, and a plurality of impurity regions;

a gate insulating film adjacent to said semiconductor island;

at least first and second gate electrodes adjacent to said first and second channel regions with said gate insulating film interposed therebetween, respectively;

a capacitor forming electrode adjacent to a portion in said semiconductor island with said gate insulating film interposed therebetween *connected to a capacitor line*;

a source line connected to said semiconductor island; and a pixel electrode connected with said semiconductor island, wherein said source line and capacitor [forming electrode] *line* cross at right angles in said active matrix region, [and]

*wherein said portion is a same conductivity as said first and second channel regions, and*

(b) said peripheral circuit comprising:
at least one CMOS circuit comprising a paur of an N-channel thin film transistor and a P-channel thin film transistor on said insulating surface of said substrate,
*wherein said N-channel thin film transistor has at least one LDD region and said P-channel thin film transistor has no LDD region.*

20. A semiconductor device comprising at least an active matrix region and a peripheral circuit,
   (a) said active matrix region comprising:
      a semiconductor island on an insulating surface of a substrate, and semiconductor island comprising at least first and second channel regions, and a plurality of impurity regions;
      a gate insulating film on said semiconductor island;
      at least first and second gate electrodes over said first and second channel regions with said gate insulating film interposed therebetween, respectively;
      a capacitor forming electrode over a portion in said semiconductor island with said gate insulating film interposed therebetween *connected to a capacitor line*;
      a source line connected to said semiconductor island; and
      a pixel electrode connected with said semiconductor island,
      wherein said source line and said capacitor [forming electrode] *line* cross at right angles in said active matrix region, [and]
      *wherein said portion is a same conductivity as said first and second channel regions, and*
   (b) said peripheral circuit comprising:
      at least one CMOS circuit comprising a pair of an N-channel thin film transistor and a P-channel thin film transistor on said insulating surface of said substrate,
      *wherein said N-channel thin film transistor has at least one LDD region and said P-channel thin film transistor has no LDD region.*

21. A semiconductor device comprising at least an active matrix region and a peripheral circuit,
   (a) said active matrix region comprising:
      a gate line connected to at least first and second gate electrodes formed over a substrate;
      a signal line formed over said substrate;
      a pixel electrode formed over said substrate;
      a semiconductor island formed over said substrate, said semiconductor island having at least:
         first and second channel regions adjacent to said first and said second gate electrodes, respectively,
         a first impurity region located adjacent to said first channel forming region and connected to said signal line,
         a second impurity region located between said first and second channel regions, and
         a third impurity region located adjacent to second channel region,
         wherein said first, second, and third impurity regions have a same conductivity type impurity; and
      a capacitor forming electrode adjacent to a portion in said semiconductor island,
      wherein said portion in the semiconductor island is a same conductivity type as said first and second channel regions, and
   (b) said peripheral circuit comprising:
      at least one CMOS circuit comprising a pair of an N-channel thin film transistor and a P-channel thin film transistor over said substrate, each of said [an] N-channel thin film transistor and [a] *said* P-channel thin film transistor comprising:
         a semiconductor island over said substrate, said semiconductor island having a channel region, and source and drain regions;
         a gate insulating film adjacent to said semiconductor island; and
         a gate electrode adjacent to said semiconductor island with said gate insulating film interposed therebetween,
         wherein said semiconductor island of [at least] said N-channel thin transistor comprises a pair of LDD regions located between said channel region and said source and drain regions, respectively, *and*
      *wherein said semiconductor island of said P-channel thin film transistor has no LDD regions.*

22. A semiconductor device comprising [at least] an active matrix region and a peripheral circuit,
   (a) said active matrix region comprising:
      a gate line connected to at least first and second gate electrodes formed over a substrate;
      a signal line formed over said substrate;
      a pixel electrode formed over said substrate;
      a semiconductor island formed over said substrate, said semiconductor island having at least:
         first and second channel regions under said first and said second gate electrodes, resectively,
         a first impurity region located adjacent to said first channel forming region and connected to said signal line,
         a second inpurity region located between said first and second channel regions, and
         a third impurity region located adjacent to second channel region,
         wherein said first, second, and third impurity regins have a same conductivity type impurity; and
      a capacitor forming electrode over a portion in said semiconductor island,
      wherein said portion in the semiconductor island is a same conductivity type as said first and second channel regions, and
   (b) said peripheral circuit comprising:
      at least one CMOS circuit comprising a pair of an N-channel thin film transistor and a P-channel thin film transistor on said insulating surface of said substrate, each of said [an] N-channel thin film transistor and [a] *said* P-channel thin film transistor comprising:
         a semiconductor island over said substrate, and semiconductor island having a channel region, and source and drain regions;
         a gate insulating film on said semiconductor island; and
         a gate electrode over said semiconductor island with said gate insulating film interposed therebetween,
         wherein said semiconductor island of [at least] said N-channel thin transistor comprises a pair of LDD regions between said channel region and said source and drain regions, respectively, *and*
         *wherein said semiconductor island of said P-channel thin film transistor has no LDD regions.*

23. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode adjacent to a portion in said semiconductor island,
wherein said portion in the semiconductor island is a same conductivity type as said first and second channel regions, and
wherein said pixel electrode is in contact with said third impurity region, said third impurity region located between said second channel region and said portion in said semiconductor island, and
(b) said peripheral circuit comprising:
at least one CMOS circuit comprising a pair of an N-channel thin film transistor and a P-channel thin film transistor over said substrate, *each of said N-channel thin film transistor and said P-channel thin film transistors comprising:*
*a semiconductor island having a channel region, and source and drain regions;*
*a gate insulating film on said semiconductor island; and*
*a gate electrode over said semiconductor island with said gate insulating film interposed therebetween,*
*wherein said semiconductor island of said N-channel thin transistor has a pair of LDD regions located between said channel region and said source and drain regions, respectively, and*
*wherein said semiconductor island of said P-channel thin film transistor has no LDD regions.*

24. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions under said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode over a portion in said semiconductor island,
wherein said portion in the semiconductor island is a same conductivity type as said first and second channel regions, and
wherein said pixel electrode is in contact with said third impurity region, said third impurity region located between said second channel region and said portion in said semiconductor island, and
(b) said peripheral circuit comprising:
at least one CMOS circuit comprising a pair of an N-channel thin film transistor and a P-channel thin film transistor over said substrate, *each of said N-channel thin film transistor and said P-channel thin film transistors comprising:*
*a semiconductor island having a channel region, and source and drain regions;*
*a gate insulating film on said semiconductor island; and*
*a gate electrode over said semiconductor island with said gate insulating film interposed therebetween,*
*wherein said semiconductor island of said N-channel thin transistor has a pair of LDD regions located between said channel region and said source and drain regions, respectively, and*
*wherein said semiconductor island of said P-channel thin film transistor has no LDD regions.*

27. A semiconductor device comprising at least an active matrix region and a peripheral circuit,
(a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode adjacent to a portion in said semiconductor island,
wherein said portion in said semiconductor island is a same conductivity type as said first and second channel regions, and
wherein said gate line is parallel to said capacitor line in said active matrix region, and
(b) said peripheral circuit comprising:
at least one CMOS circuit comprising a pair of an N-channel thin film transistor and a P-channel thin film transistor over said substrate, *each of said N-channel thin film transistor and said P-channel thin film transistors comprising:*
*a semiconductor island having a channel region, and source and drain regions;*
*a gate insulating film on said semiconductor island; and*
*a gate electrode over said semiconductor island with said gate insulating film interposed therebetween,*
*wherein said semiconductor island of said N-channel thin transistor has a pair of LDD regions located* between said channel region and said source and drain regions respectively, and wherein said semiconductor island of said P-channel thin film transistor has no LDD regions.

28. A semiconductor device comprising at least an active matrix region and a peripheral circuit, (a) said active matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions under said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode over a portion in said semiconductor island connected to a capacitor line,
wherein said portion in said semiconductor island is a same conductivity type as said first and second channel regions, and
wherein said gate line is parallel to said capacitor line in said active matrix region, and (b) said peripheral circuit comprising:
at least one CMOS circuit comprising a pair of an N-channel thin film transistor and a P-channel thin film transistor over said substrate, *each of said N-channel thin film transistor and said P-channel thin film transistors comprising:*
*a semiconductor island having a channel region, and source and drain regions;*
*a gate insulating film on said semiconductor island; and*
*a gate electrode over said semiconductor island with said gate insulating film interposed therebetween,*
*wherein said semiconductor island of said N-channel thin transistor has a pair of LDD regions located between said channel region and said source and drain regions, respectively, and*
*wherein said semiconductor island of said P-channel thin film transistor has no LDD regions*

29. A semiconductor device comprising at least an active matrix region and a peripheral circuit, (a) said device matrix region comprising:
a gate line connected to at least first and second gate electrodes formed over a substrate;
a signal line formed over said substrate;
a pixel electrode formed over said substrate;
a semiconductor island formed over said substrate, said semiconductor island having at least:
first and second channel regions adjacent to said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode adjacent to a portion in said semiconductor island connected to a capacitor line,
wherein said portion in said semiconduuctor island a same conductivity type as said first and second channel regions,
wherein said source line and said capacitor forming electrode cross at right angles in said active matrix region, and (b) said peripheral circuit comprising:
at least one CMOS circuit comprising a pair of an N-channel thin film transistor and a P-channel thin film transistor over said substrate, *each of said N-channel thin film transistor and said P-channel thin film transistors comprising:*
*a semiconductor island having a channel region, and source and drain regions;*
*a gate insulating, film on said semiconductor island; and*
*a gate electrode over said semiconductor island with said gate insulating film interposed therebetween,*
*wherein said semiconductor island of said N-channel thin transistor has a pair of LDD regions located between said channel region and said source and drain regions, respectively, and*
*wherein said semiconductor island of said P-channel thin film transistor has no LDD regions.*

30. A semiconductor device comprising at least an active matrix region and a peripheral circuit, (a) said active matrix region comprising:
a gate line connected to at least first and second gate electrodes formed over a substrate;
a signal line formed over said substrate;
a pixel electrode formed over said substrate;
a semiconductor island over said substrate, said semiconductor island having at least:
first and second channel region under said first and said second gate electrodes, respectively,
a first impurity region located adjacent to said first channel forming region and connected to said signal line,
a second impurity region located between said first and second channel regions, and
a third impurity region located adjacent to second channel region,
wherein said first, second, and third impurity regions have a same conductivity type impurity; and
a capacitor forming electrode over a portion in said semiconductor island,
wherein said portion in said semiconductor island a same conductivity type as said first and second channel regions,
wherein said source line and said capacitor forming electrode cross at right angles in said active matrix region, and (b) said peripheral circuit comprising:
at least one CMOS circuit comprising a pair of an N-channel thin film transistor and a P-channel thin film transistor over said substrate, *each of said N-channel thin film transistor and said P-channel thin film transistors comprising:*
*a semiconductor island having a channel region, and source and drain regions;* a gate insulating film on said semiconductor island; and a gate electrode over said semiconductor island with said gate insulating fiilm interposed therebetween, wherein said semiconductor island of said N-channel thin transistor has a pair of LDD regions located between said channel region and said source and drain regions, respectively, and wherein said semiconductor island of said P-channel thin film transistor has no LDD regions.

31. A semiconductor device according to any one of claims 1 to 10, 13 to 16, 24 and 25, wherein said P-channel thin film transistor has no LDD region.

* * * * *